United States Patent
Kim et al.

(10) Patent No.: US 12,446,443 B2
(45) Date of Patent: Oct. 14, 2025

(54) DISPLAY PANEL AND DISPLAY DEVICE

(71) Applicant: Samsung Display Co., Ltd., Yongin-si (KR)

(72) Inventors: Kyungmin Kim, Yongin-si (KR); Junhyeong Park, Yongin-si (KR); Jiyeon Seo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 538 days.

(21) Appl. No.: 17/979,387

(22) Filed: Nov. 2, 2022

(65) Prior Publication Data
US 2023/0147646 A1     May 11, 2023

(30) Foreign Application Priority Data

Nov. 5, 2021 (KR) .................. 10-2021-0151664

(51) Int. Cl.
*H10K 50/844* (2023.01)
*H10K 59/131* (2023.01)

(52) U.S. Cl.
CPC ......... *H10K 50/844* (2023.02); *H10K 59/131* (2023.02)

(58) Field of Classification Search
CPC ........................... H10K 50/844; H10K 59/131
USPC ......................................................... 257/40
See application file for complete search history.

(56) References Cited

U.S. PATENT DOCUMENTS

| | | | |
|---|---|---|---|
| 10,205,122 B2 | 2/2019 | Choi et al. | |
| 10,476,032 B2 | 11/2019 | Park et al. | |
| 10,673,020 B2 | 6/2020 | Kim | |
| 11,349,089 B2 | 5/2022 | Park et al. | |
| 2020/0403050 A1* | 12/2020 | Seon | H10K 59/122 |
| 2020/0403171 A1* | 12/2020 | Park | H10K 59/38 |

FOREIGN PATENT DOCUMENTS

| | | |
|---|---|---|
| CN | 112117306 A | 12/2020 |
| KR | 1020170059864 A | 5/2017 |
| KR | 1020190084194 A | 7/2019 |
| KR | 1020200036130 A | 4/2020 |
| KR | 1020200145952 A | 12/2020 |

* cited by examiner

*Primary Examiner* — Xia L Cross
(74) *Attorney, Agent, or Firm* — CANTOR COLBURN LLP

(57) ABSTRACT

A display panel includes a substrate including a first area and a second area which is adjacent to the first area, an encapsulation layer including a lower pattern in the second area, an insulating layer on the first area and the second area and defining an opening exposing a side surface of the lower pattern, an upper pattern on the insulating layer, protruding toward a center of the lower pattern and having a tip overlapping the side surface of the lower pattern, and an inorganic encapsulation layer in direct contact with the lower pattern.

20 Claims, 20 Drawing Sheets

DISPLAY PANEL AND DISPLAY DEVICE

This application claims priority to Korean Patent Application No. 10-2021-0151664, filed on Nov. 5, 2021 and all the benefits accruing therefrom under 35 U.S.C. § 119, the disclosure of which is incorporated by reference herein in its entirety.

BACKGROUND

1. Field

One or more embodiments relate to a display panel and a display device.

2. Description of the Related Art

As display devices that visually display an electrical signal have been developed, various display devices having excellent properties such as thinness, light weight, and low power consumption are being introduced. Flexible display devices that are bendable to be disposed to have an angle in a flat state or rollable in a roll shape, have been studied and developed. Furthermore, research and development of stretchable display devices that can be changed in shape into various forms are also being conducted.

SUMMARY

One or more embodiments include a display panel and a display device in which penetration of oxygen or moisture from the outside is minimized so that the reliability of the display panel and the display device may be enhanced. However, such an objective is just an example, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate including a first area and a second area which is adjacent to the first area, an encapsulation layer including a lower pattern in the second area, an insulating layer on the first area and the second area and defining an opening exposing a side surface of the lower pattern, an upper pattern on the insulating layer, protruding toward a center of the lower pattern and having a tip overlapping the side surface of the lower pattern, and an inorganic encapsulation layer in direct contact with the lower pattern.

The inorganic encapsulation layer may be in direct contact with a side surface of the lower pattern.

The inorganic encapsulation layer may be in direct contact with the tip.

The insulating layer may include a first insulating layer, a second insulating layer on the first insulating layer, and an inorganic layer between the first insulating layer and the second insulating layer. The first insulating layer may have a through portion in the first area, and the inorganic layer may cover a side surface and a bottom surface of the through portion.

The lower pattern may include a plurality of sub-patterns spaced apart from each other by a distance, and side surfaces of the plurality of sub-patterns may overlap the tip.

The lower pattern may include a conductive material.

The display panel may further include an insulating pattern between the bottom surface of the opening and the lower pattern, and a width of the lower pattern may be greater than a width of the insulating pattern.

The inorganic encapsulation layer may be in direct contact with the bottom surface of the lower pattern.

The substrate may further include a central area, the first area may be provided in plural, and a plurality of first areas may extend in a direction away from the central area. A separation area may be defined between a portion of the second area between the adjacent first areas, and another portion of the second area between the adjacent first areas.

The lower pattern may be adjacent to each of the first areas, and the upper pattern may include a first inorganic pattern on the second area and overlapping an outer side surface of the lower pattern, and a second inorganic pattern on the first area and overlapping an inner side surface of the lower pattern.

The display panel may further include a corner wiring on the second area and extended along each of the plurality of first areas, and the lower pattern may extend along a top surface of the corner wiring.

According to one or more embodiments, a display device includes a display panel and a cover window which is on the display panel. The display panel includes a substrate including a central area, a first area at a corner and bent, and a second area which is adjacent to the first area, a lower pattern on the second area, an insulating layer on the first area and the second area and defining an opening for exposing a side surface of the lower pattern, an upper pattern on the insulating layer and having a tip protruding toward a center of the lower pattern and overlapping a side surface of the lower pattern, a display element layer including a first electrode, an emission layer overlapping the first electrode, and a second electrode, which are sequentially stacked on each other, and an encapsulation layer on the display element layer and including an inorganic encapsulation layer in direct contact with the lower pattern.

The first area may be provided in plural, each of a plurality of first areas may extend in a direction away from the central area, and a separation area that is an empty space may be defined between a portion of the second area between the adjacent first areas and another portion of the second area between the adjacent first areas.

According to one or more embodiments, a display panel includes a substrate including a first area in which a display element is arranged, and a plurality of second areas which extend from the first area in different directions, a lower pattern on the first area along a boundary between the first area and the second area, an insulating layer on the first area and the second area and having an opening for exposing a side surface of the lower pattern, an upper pattern on the insulating layer and having a tip protruding toward a center of the lower pattern and overlapping the side surface of the lower pattern, a display element layer including a first electrode, an emission layer overlapping the first electrode and a second electrode, which are sequentially stacked on each other, and an encapsulation layer on the display element layer and including an inorganic encapsulation layer in direct contact with the lower pattern.

The inorganic encapsulation layer may be in direct contact with the side surface of the lower pattern.

The lower pattern may include a plurality of sub-patterns spaced apart from each other by a distance, and one of side surfaces of the plurality of sub-patterns may overlap the tip.

The insulating layer may include a first insulating layer, a second insulating layer on the first insulating layer, and an inorganic layer between the first insulating layer and the second insulating layer, where the first insulating layer defines a through portion on the first area, and the inorganic layer may cover a side surface and a bottom surface of the through portion.

The display panel may further include an insulating pattern between a bottom surface of the opening and the lower pattern, and a width of the lower pattern may be greater than a width of the insulating pattern.

The display panel may further include a spacer on the first area, and the lower pattern may be on the first area to be adjacent to the spacer, and the upper pattern may include a first inorganic pattern overlapping the spacer and one side surface of the lower pattern, and a second inorganic pattern spaced apart from the first inorganic pattern with the lower pattern therebetween and overlapping another side surface of the lower pattern.

The substrate may have a structure in which basic units including the first area and the plurality of second areas are repeatedly arranged, and a separation area that is an empty space may be defined in the basic units adjacent to each other.

Other aspects, features, and advantages than those described above may be apparent from the following drawings, the claims, and the detailed description of the disclosure.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
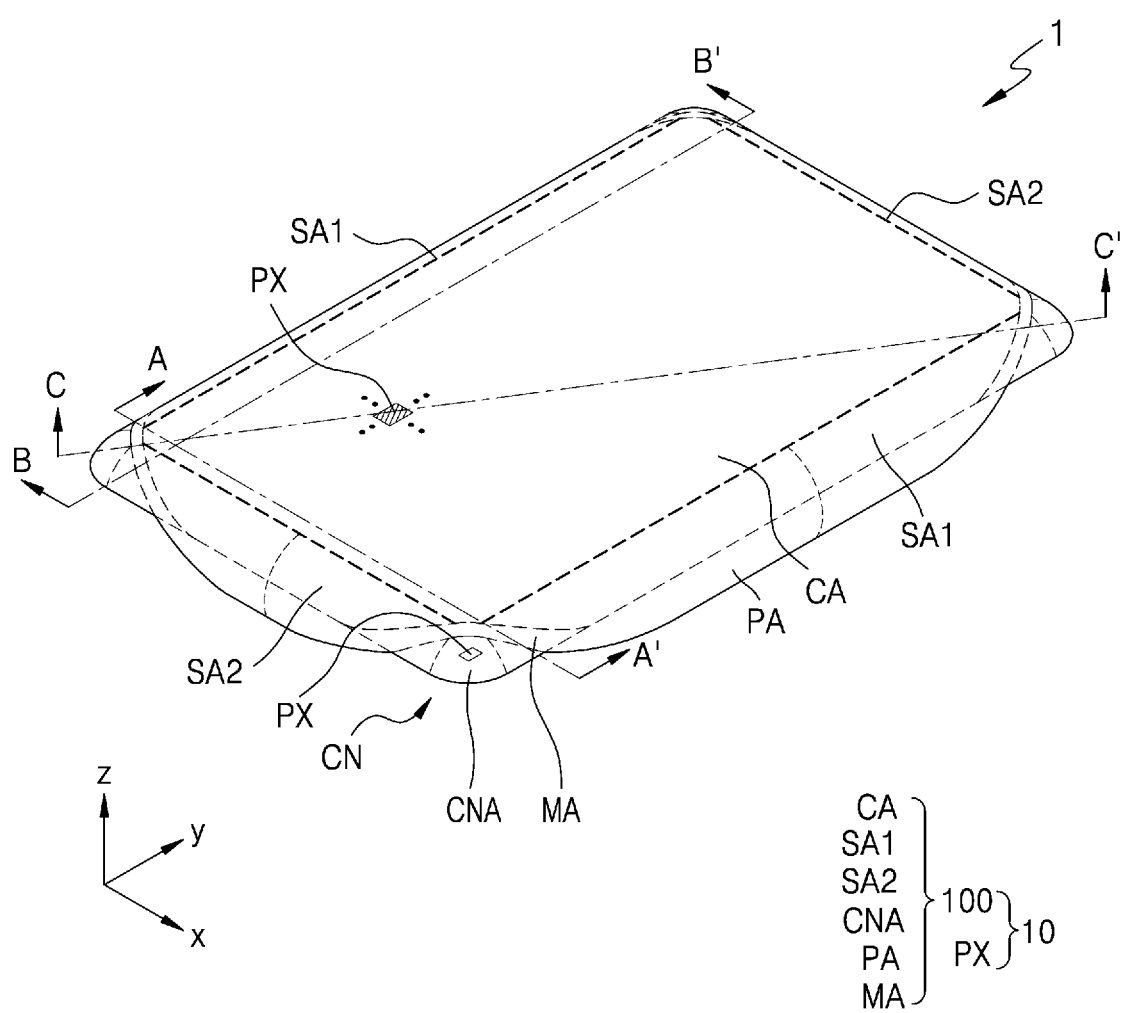
FIG. 1 is a perspective view schematically illustrating a display device according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the present specification, the terms of the first and second, etc. were used for the purpose of distinguishing one component from other components, not a limited sense.

The terminology used herein is for the purpose of describing particular embodiments only and is not intended to be limiting. In the present specification, the singular expression includes a plurality of expressions unless the context is clearly different. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, a reference number may indicate a singular element or a plurality of the element. For example, a reference number labeling a singular form of an element within the drawing figures may be used to reference a plurality of the singular element within the text of specification.

In the present specification, the terms such as comprising or having are meant to be the features described in the specification, or the components are present, and the possibility of one or more other features or components will be added, is not excluded in advance.

In the present specification, when a portion such as a layer, a region, a component or the like is described such as being "on" other portions, this is not only when the portion is "directly on" other components, but also when other components are interposed therebetween. In contrast, when a portion such as a layer, a region, a component or the like is described such as being "directly on" other portions, other components are not interposed therebetween.

In the present specification, when a layer, a region, a component or the like is connected to other components, this is not only when a layer, a region, a component or the like is directly connected to each other or/and but also when a layer, a region, a component or the like is indirectly connected to each other while another layer, another region, another component or the like is interposed therebetween. For example, in the present specification, when a layer, a region, a component or the like is electrically connected to each other, this is not only when a layer, a region, a component or the like is directly electrically connected to each other and/or but also when a layer, a region and a component or the like is indirectly electrically connected to each other while another layer, another region, another component or the like is interposed therebetween.

In the present specification, "A and/or B" indicates A, B, or A and B. In addition, "at least one of A and B" indicates A, B, or A and B.

In the present specification, the x-axis, y-axis, and z-axis are not limited to three axes on an orthogonal coordinate system, and may be interpreted in a broad sense including this case. For example, the x-axis, the y-axis, and the z-axis may be orthogonal to each other, but may refer to different directions that do not orthogonal to each other.

In the case where embodiments may be implemented in the present specification, a specific process order may be performed differently from the order described. For example, two processes described in succession may be substantially performed at the same time, or in an opposite order to an order to be described.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, for convenience of description, the sizes of components may be exaggerated or reduced. For example, since the size and thickness of each component shown in the drawings are arbitrarily indicated for convenience of description, the present disclosure is not necessarily limited to the illustration.

Figure 2A:
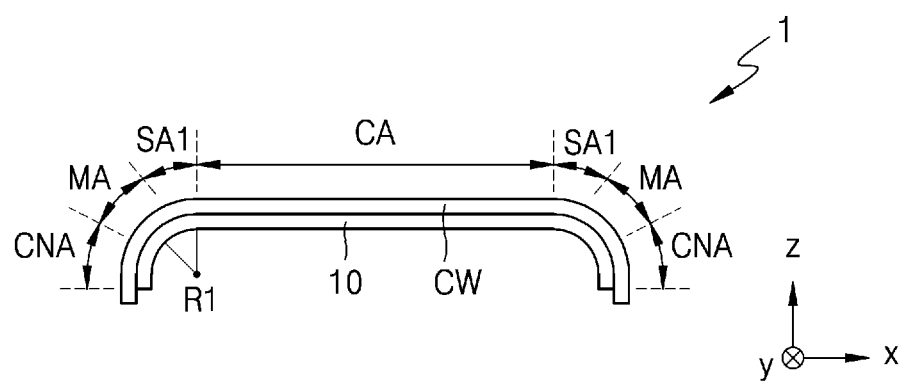
FIG. 2A is a cross-sectional view of the display device of FIG. 1 taken along line A-A.
Figure 2B:
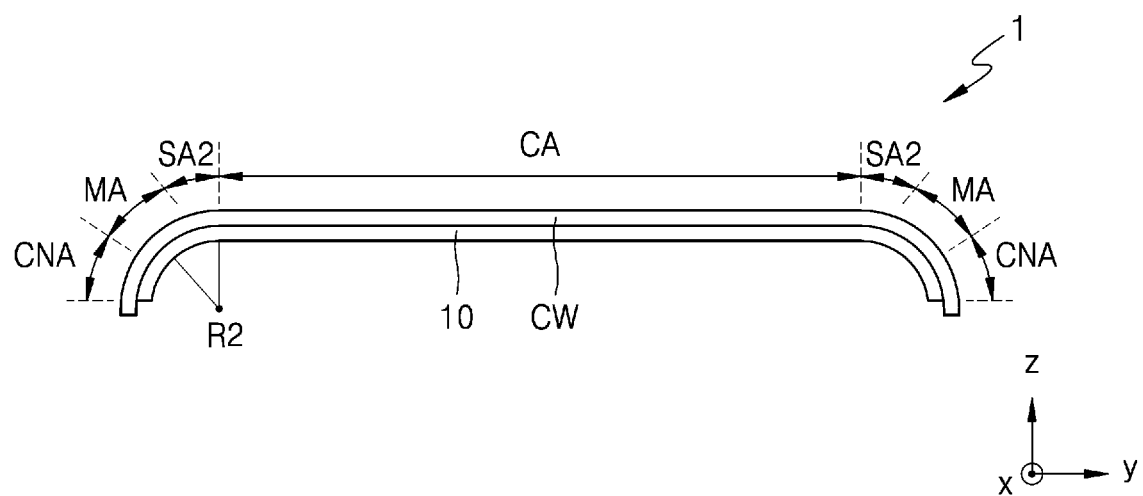
FIG. 2B is a cross-sectional view illustrating the display device of FIG. 1 taken along line B-B.
Figure 2C:
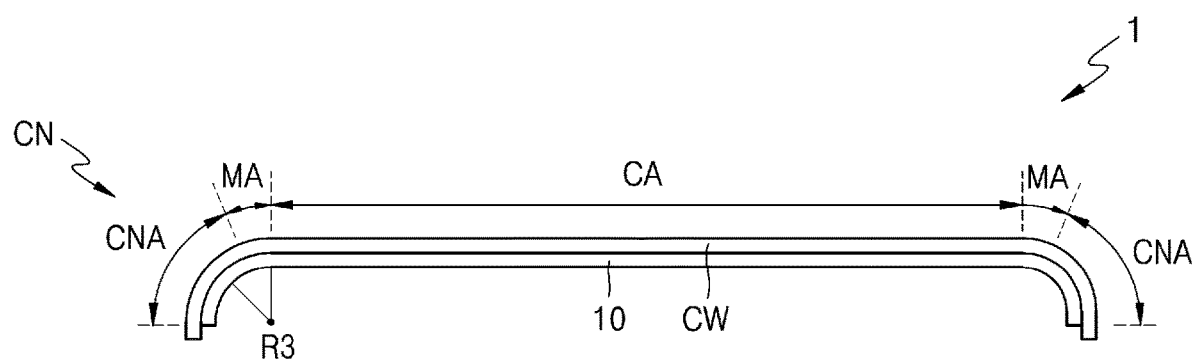
FIG. 2C is a cross-sectional view illustrating the display device taken along line C-C'.

FIG. 1 is a perspective view schematically illustrating a display device 1 according to an embodiment, FIG. 2A is a cross-sectional view of the display device 1 of FIG. 1 taken along line A-A', FIG. 2B is a cross-sectional view of the display device 1 of FIG. 1 taken along line B-B', and FIG. 2C is a cross-sectional view of the display device 1 of FIG. 1 taken along line C-C'.

Referring to FIG. 1 and FIGS. 2A through 2C, the display device 1 may display an image. The display device 1 may have an edge extended in a first direction and an edge extended in a second direction. Here, the first direction and the second direction may cross each other. A plane may be defined by the first direction and the second direction crossing each other. In an embodiment, for example, the first direction and the second direction may form an acute angle. As another example, the first direction and the second direction may form an obtuse angle or may be orthogonal to each other. Hereinafter, a case where the first direction and the second direction are orthogonal to each other, will be described in detail. In an embodiment, for example, the first direction may be an x-direction or an −x-direction, and the second direction may be a y-direction or a −y-direction.

In an embodiment, a corner CN in which the edge in the first direction (e.g., an x-direction or a −x-direction) and the edge in the second direction (e.g., a y-direction or −y-direction) meet each other, may have a curvature. The curvature may extend along a third direction (e.g., an −z-direction) from a reference plane.

The display device 1 may include a cover window CW and a display panel 10 which faces the cover window CW, The cover window CW may function to protect the display panel 10. In an embodiment, the cover window CW may be arranged on the display panel 10. In an embodiment, the cover window CW may be a flexible window. The cover window CW may be easily bent according to external force without the occurrence of cracks, to protect the display panel 10. The cover window CW may include a glass, sapphire, or plastic. The cover window CW may be, for example, ultra-thin glass (UTG) or colorless polyimide (CPI). In an embodiment, the cover window CW may have a structure in which a polymer layer having flexibility is arranged on one surface of a glass substrate, or may include only a polymer layer.

The display panel 10 may be arranged under the cover window CW Although not shown, the display panel 10 may be attached to the cover window CW by using a transparent adhesive member, such as an optically clear adhesive (OCA) film.

The display panel 10 may display an image. The display panel 10 may include a substrate 100 and a pixel PX. The substrate 100 may include a central area CA, a first side area SA1, a second side area SA2, a corner area CNA, a middle area MA, and a peripheral area PA. In an embodiment, the shape of the substrate 100 may define the shape of the display device 1.

The central area CA may be a flat area, such as being disposed in one plane. In an embodiment, the display device 1 may provide a primary image to the central area CA.

The first side area SA1 may be adjacent to the central area CA in the first direction (e.g., an x-direction or −x-direction) and may be bent. The first side area SA1 may be defined as an area bent from the central area CA in a cross section (e.g., an xz cross section) in the first direction (e.g., an x-direction or −x-direction). The first side area SA1 may extend in a second direction (e.g., a y-direction or −y-direction). In other words, the first side area SA1 may not be bent in a cross section (e.g., an yz cross section) in the second direction (e.g., a y-direction or −y-direction). The first side area SA1 may extend from the central area CA in the first direction (e.g., an x-direction or −x-direction). In FIG. 2A, the first side area SA1 that extends from the central area CA in the x-direction and is bent, and the first side area SA1 that extends from the central area CA in the −x-direction and is bent, may have the same curvature. In an embodiment, the first side area SA1 that extends from the central area CA in the x-direction and is bent, and the first side area SA1 that extends from the central area CA in the −x-direction and is bent, may have different curvatures.

The second side area SA2 may be adjacent to the central area CA in the second direction (e.g., a y-direction or −y-direction) and may be bent. The second side area SA2 may be defined as an area bent from the central area CA in a cross section (e.g., an yz cross section) in the second direction (e.g., a y-direction or −y-direction). The second side area SA2 may extend in the first direction (e.g., an x-direction or −x-direction). The second side area SA2 may not be bent in a cross section (e.g., an xz cross section) orthogonal to the first direction (e.g., an x-direction or −x-direction). In FIG. 2B, the first side area SA1 that extends from the central area CA in the y-direction and is bent, and the second side area SA2 that extends from the central area CA in the −y-direction and is bent, may have the same curvature. In an embodiment, the second side area SA2 that extends from the central area CA in the y-direction and is bent, and the second side area SA2 that extends from the central area CA in the −y-direction and is bent, may have different curvatures.

The corner area CNA may be an area corresponding to the corner CN. In an embodiment, the corner area CNA may be an area in which the edge of the display device 1 in the first direction (e.g., an x-direction or −x-direction) and the edge of the display device 1 in the second direction (e.g., a y-direction or −y-direction) meet each other. In an embodiment, the corner area CNA may surround (or extend along) at least a portion of the central area CA, the first side area SA1, and the second side area SA2. Alternatively, the corner area CNA may surround (or extend along) at least a portion of the first side area SA1, the second side area SA2, and the middle area MA. When an end portion of the first side area SA1 extends bent in the first direction (e.g., an x-direction or −x direction), and an end portion of the second side area SA2 extends bent in the second direction (e.g., a y-direction or −y-direction), at least a portion of the corner area CNA may extend in the first direction (e.g., an x-direction or −x-direction) and may be bent and simultaneously, may extend in the second direction (e.g., a y-direction or −y-direction) and may be bent. In other words, at least a portion of the corner area CNA may be a curved area in which a plurality of curvatures overlap in a plurality of directions. In an embodiment, a plurality of corner areas CNA may be provided.

The middle area MA may be between the central area CA and the corner area CNA. In an embodiment, the middle area MA may extend between the first side area SA1 and the corner area CNA. In an embodiment, the middle area MA may extend between the second side area SA2 and the corner area CNA. In an embodiment, the middle area MA may be bent. A driving circuit DC for providing an electrical signal to the pixel PX and/or a power wiring for providing power, may be arranged in the middle area MA. In this case, the pixel PX arranged in the middle area MA may overlap the driving circuit DC and/or the power wiring. In embodiments, the driving circuit DC and/or the power wiring arranged in the middle area MA may be omitted.

The peripheral area PA may be arranged outside the central area CA. In an embodiment, the peripheral area PA may be outside the first side area SA1. The peripheral area PA may extend from the first side area SA1, to define an end or edge of the display panel 10, In an embodiment, the peripheral area PA may be outside the second side area SA2. The peripheral area PA may extend from the second side area SA2, to define an end or edge of the display panel 10. The pixel PX may not be arranged in the peripheral area PA. Thus, the peripheral area PA may be a non-display area in which no image is displayed. A driving circuit DC for providing an electrical signal to the pixel PX and/or a power wiring for providing power may be arranged in the peripheral area PA.

Referring to FIG. 2A, a portion of the first side area SA1, the middle area MA, and the corner area CNA may be bent together to have a first curvature radius R1. Referring to FIG. 2B, a portion of the second side area SA2, the middle area MA, and the corner area CNA may be bent together to have a second curvature radius R2. Referring to FIG. 2C, a portion of the middle area MA and the corner area CNA may be bent to have a third curvature radius R3.

The pixel PX may be arranged on the substrate 100. In an embodiment, a plurality of pixels PX may be provided, and the plurality of pixels PX may display an image by emitting light. In an embodiment, each of the plurality of pixels PX may include a red sub-pixel Pr, a green sub-pixel Pg, and a blue sub-pixel Pb. Alternatively, each of the plurality of pixels PX may include a red sub-pixel Pr, a green sub-pixel Pg, a blue sub-pixel Pb and a white sub-pixel.

The pixel PX may be arranged in at least one of the central area CA, the first side area SA1, the second side area SA2, and the corner area CNA. In an embodiment, the plurality of pixels PX may be arranged in the central area CA, the first side area SA1, the second side area SA2, the corner area CNA, and the middle area MA. In this case, the display device 1 may display an image in the central area CA, the first side area SA1, the second side area SA2, the corner area CNA, and the middle area MA. In an embodiment, each of the plurality of pixels PX arranged in the central area CA, the first side area SA1, the second side area SA2, the corner area CNA, and the middle area MA may provide an independent image. In an embodiment, each of the plurality of pixels PX arranged in the central area CA, the first side area SA1, the second side area SA2, the corner area CNA, and the middle area MA may provide portions of one image.

The display device 1 may display an image in the central area CA, the first side area SA1, the second side area SA2, the middle area MA, and the corner area CNA. Thus, the ratio of a display area, which is an area in which an image is displayed, in the display device 1 may increase. Furthermore, the display device 1 may be bent in the corner CN and may display an image, so that an aesthetic sense may be enhanced.

Figure 3:
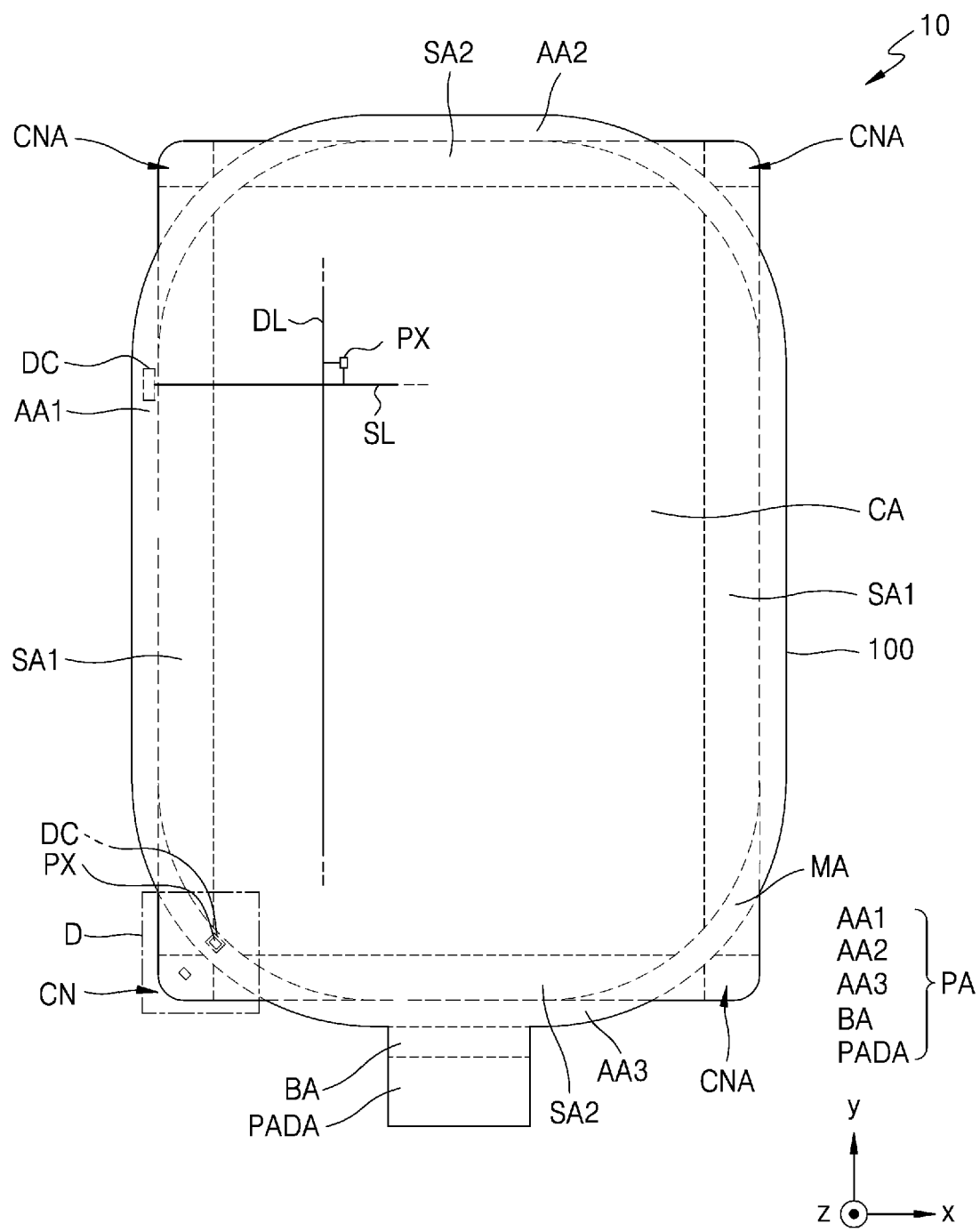
FIG. 3 is a plan view schematically illustrating a display panel according to an embodiment.

FIG. 3 is a plan view schematically illustrating a display panel 10 according to an embodiment.

Referring to FIG. 3, the display panel 10 may display an image. The display panel 10 may include a substrate 100, a pixel PX, and a driving circuit DC. The substrate 100 may include a central area CA, a first side area SA1, a second side area SA2, a corner area CNA, a middle area MA, and a peripheral area PA. The central area CA may be a flat area. In an embodiment, the display device 1 may provide a primary image to the central area CA.

The first side area SA1 may be adjacent to the central area CA, in the first direction (e.g., an x-direction or –x-direction). In an embodiment, the first side area SA1 may be disposed between the central area CA and the peripheral area PA. The first side area SA1 may extend from the central area CA, in the first direction (e.g., an x-direction or –x-direction).

The second side area SA2 may be adjacent to the central area CA, in the second direction (e.g., a y-direction or –y-direction). In an embodiment, the second side area SA2 may be arranged between the central area CA and the peripheral area PA. The second side area SA2 may extend from the central area CA, in the second direction (e.g., a y-direction or –y-direction).

The corner area CNA may be an area at the corner CN of the display panel 10. In an embodiment, the corner area CNA may be an area in which the edge of the display panel 10 in the first direction (e.g., an x-direction or –x-direction) and the edge of the display panel 10 in the second direction (e.g., a y-direction or –y-direction) meet each other. In an embodiment, the corner area CNA may surround at least a portion of the central area CA, the first side area SA1, and the second side area SA2. The corner area CNA may surround at least a portion of the central area CA, the first side area SA1, the second side area SA2, and the middle area MA.

The middle area MA may be between the central area CA and the corner area CNA. In an embodiment, the middle area MA may extend between the first side area SA1 and the corner area CNA. In an embodiment, the middle area MA may extend between the second side area SA2 and the corner area CNA. A driving circuit DC for providing an electrical signal to the pixel PX and/or a power wiring for providing power may be arranged in the middle area MA. In this case, the pixel PX arranged in the middle area MA may overlap the driving circuit DC and/or the power wiring. In embodiments, the driving circuit DC and/or the power wiring arranged in the middle area MA may be omitted.

The peripheral area PA may be arranged outside the central area CA. The pixel PX may not be arranged in the peripheral area PA. Thus, the peripheral area PA may be a non-display area in which no image is displayed. The driving circuit DC for providing an electrical signal to the pixel PX and/or a power wiring for providing power may be arranged in the peripheral area PA. The peripheral area PA may include a first adjacent area AA1, a second adjacent area AA2, a third adjacent area AA3, a bending area BA, and a pad area PADA.

The first adjacent area AA1 may be outside the first side area SA1. In other words, the first side area SA1 may be disposed between the first adjacent area AA1 and the central area CA. The first adjacent area AA1 may extend from the first side area SA1. In an embodiment, the first adjacent area AA1 may extend from the first side area SA1, in the first direction (e.g., an x-direction or –x-direction). In an embodiment, a driving circuit DC may be disposed in the first adjacent area AA1.

The second adjacent area AA2 and the third adjacent area AA3 may be outside the second side area SA2. In other words, the second side area SA2 may be arranged between the second adjacent area AA2 and the central area CA. In other words, the second side area SA2 may be arranged between the third adjacent area AA3 and the central area CA. The second adjacent area AA2 and the third adjacent area AA3 may extend from the second side area SA2. In an embodiment, the second adjacent area AA2 and the third adjacent area AA3 may extend in the second direction (e.g., a y-direction or –y-direction). The central area CA may be arranged between the second adjacent area AA2 and the third adjacent area AA3.

The bending area BA may be arranged outside the third adjacent area AA3. In other words, the third adjacent area AA3 may be arranged between the bending area BA and the second side area SA2, and further from the central area CA than third adjacent area AA3. The display panel 10 may be bendable at the bending area BA. In this case, the display panel 10 which is bent may dispose the pad area PADA facing a rear surface of the display panel 10 that is opposite to a top surface at which an image is displayed. Thus, a planar area of the peripheral area PA which is visible from outside the display device 1 may be reduced.

The pad area PADA may be arranged outside the bending area BA. In other words, the bending area BA may be arranged between a third adjacent area AA3 and the pad area PADA. A pad (not shown) may be arranged in the pad area PADA. The display panel 10 may receive an electrical signal and/or a power supply voltage from outside the display panel 10, through the pad (not shown).

At least one of the first side area SA1, the second side area SA2, the corner area CNA, and the middle area MA may be bent. In an embodiment, for example, a portion of the first side area SA1 and the corner area CNA may be bent in a cross section (e.g., an xz cross section) in the first direction (e.g., an x-direction or –x-direction), relative to the central area CA. A portion of the second side area SA2 and the corner area CNA may be bent in a cross section (e.g., an yz cross section) in the second direction (e.g., a y-direction or –y-direction), relative to the central area CA. A portion of the corner area CNA may be bent in a cross section (e.g., an xz cross section) in the first direction (e.g., an x-direction or –x direction) and may be bent in a cross section (e.g., an yz cross section) in the second direction (e.g., a y-direction or –y-direction).

When the corner area CNA is bent, a larger compressive strain than a tensile strain may be generated at the corner area CNA. In this case, the substrate 100 and the multi-layered structure on the substrate 100 which is contractible may be applied to at least a portion of the corner area CNA. In an embodiment, the structure of the display panel 10 in the corner area CNA may be different from the structure of the display panel 10 in the central area CA.

The pixel PX and the driving circuit DC may be arranged on the substrate 100. The pixel PX may be arranged in at least one of the central area CA, the first side area SA1, the second side area SA2, the corner area CNA, and the middle area MA. In an embodiment, a plurality of pixels PX may be provided. The plurality of pixels PX may include a display element DPE. In an embodiment, the display element DPE may be an organic light emitting diode OLED including an organic light emitting layer. Alternatively, the display element DPE may be a light emitting diode (LED) including an inorganic light emitting layer. The size of the LED may be a micro scale or a nano scale. In an embodiment, for example, the LED may be a micro LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the display element DPE may be a quantum dot light emitting diode including a quantum dot light emitting layer.

The pixels PX may include a plurality of sub-pixels, and each of the plurality of sub-pixels may emit light of a color using the display element DPE. In the present specification, the plurality of sub-pixels mean or correspond to an emission area EMA as a minimum unit that implements an image. When an organic light emitting diode BLED is used as the display element DPE, the emission area EMA may be defined by an opening 220OP of a pixel-defining layer 220. This will be described later.

The driving circuit DC may be a scan driving circuit for providing a scan signal to each pixel PX, through a scan line SL. Alternatively, the driving circuit DC may be a data driving circuit for providing a data signal to each pixel PX, through a data line DL, In an embodiment, the data driving circuit may be arranged in the third adjacent area AA3 or the pad area PADA. Alternatively, the data driving circuit may be arranged on a display circuit board connected to the data driving circuit through the pad.

Figure 4:
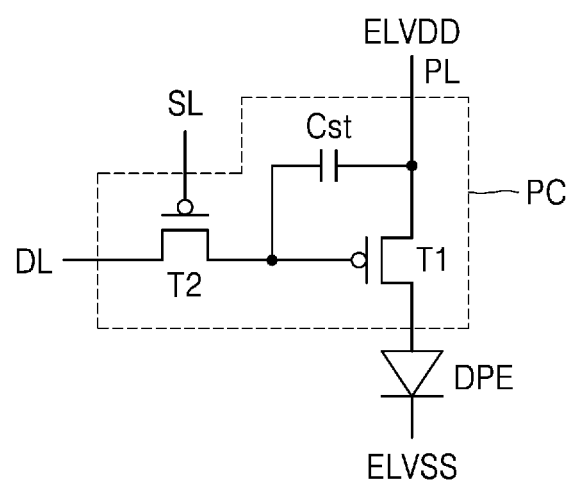
FIG. 4 is an equivalent circuit diagram schematically showing a pixel circuit that may be applied to the display panel.

FIG. 4 is an equivalent circuit diagram schematically showing a pixel circuit PC that may be applied to the display panel 10.

Referring to FIG. 4, the pixel circuit PC may be electrically connected to a display element DPE. The pixel circuit PC may include a driving thin film transistor T1, a switching thin film transistor T2, and a storage capacitor Cst. In an embodiment, the display element DPE may emit red light, green light or blue light, or red light, green light, blue light or white light.

The switching thin film transistor T2 may be connected to the scan line SL and the data line DL and may transmit a data signal or data voltage input from the data line DL to the driving thin film transistor T1, based on a scan signal or switching voltage input from the scan line SL.

The storage capacitor Cst may be connected to the switching thin film transistor T2 and the driving voltage line PL and may store a voltage corresponding to a difference between a voltage transmitted from the switching thin film transistor T2 and a first power supply voltage ELVDD supplied to a driving voltage line PL.

The driving thin film transistor T1 may be connected to the driving voltage line PL and the storage capacitor Cst and may control a driving (electrical) current flowing through the OLED from the driving voltage line PL, in response to a voltage value stored in the storage capacitor Cst. The display element DPE may emit light having a brightness using the driving current. An opposite electrode of the display element DPE may receive a second power supply voltage ELVSS.

FIG. 4 illustrates that the pixel circuit PC includes two thin film transistors and one storage capacitor, but the pixel circuit PC may include two or more thin film transistors and/or one or more storage capacitors.

Figure 5:
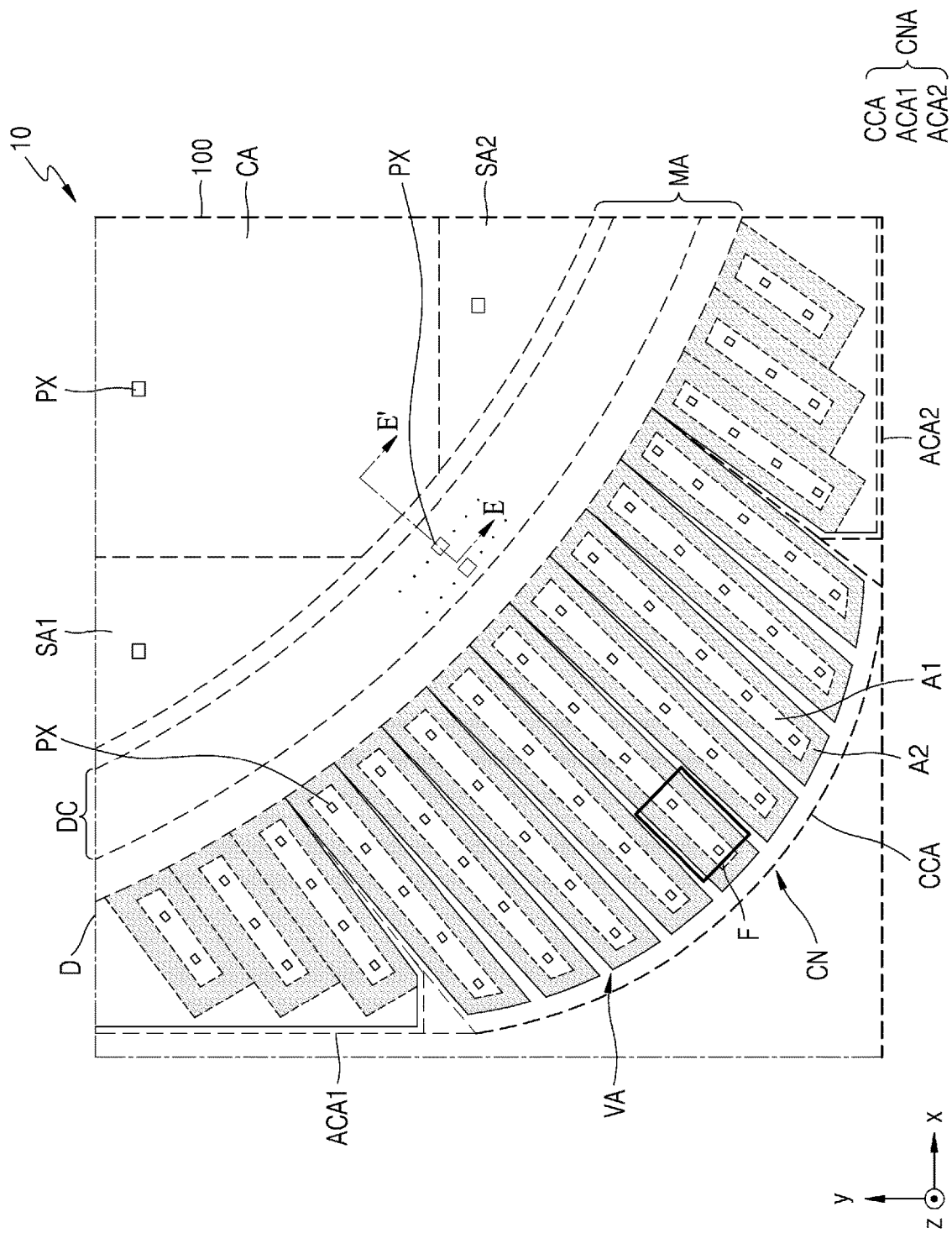
FIG. 5 is an enlarged view of portion D of the display panel of FIG. 3.

FIG. 5 is an enlarged view of portion D of the display panel 10 of FIG. 3.

Referring to FIG. 5, the substrate 100 may include a central area CA, a first side area SA1, a second side area SA2, and a corner area CNA.

The first side area SA1 may be adjacent to the central area CA in the first direction (e.g., an x-direction or –x-direction). The first side area SA1 may extend from the central area CA in the first direction (e.g., an x-direction or –x-direction). The second side area SA2 may be adjacent to the central area CA in the second direction (e.g., a y-direction or –y-direction). The second side area SA2 may extend from the central area CA in the second direction (e.g., a y-direction or –y-direction).

The corner area CNA may be an area at the corner CN of the display panel 10. In an embodiment, the corner area CNA may be an area in which the edge of the display panel 10 in the first direction (e.g., an x-direction or –x-direction) and the edge of the display panel 10 in the second direction (e.g., a y-direction or –y-direction) meet each other. In an embodiment, the corner area CNA may surround at least a portion of the central area CA, the first side area SA1, and the second side area SA2. The corner area CNA may surround at least a portion of the central area CA, the first side area SA1, the second side area SA2, and the middle area MA. The corner area CNA may include a central corner area CCA, a first adjacent corner area ACA1, and a second adjacent corner area ACA2.

A central corner area CCA may extend in a direction away from the central area CA. The central corner area CCA may include a first area A1 and a second area A2. In an embodiment, the central corner area CCA may include a plurality of first areas A1. Each of the plurality of first areas A1 may extend in a direction away from the central area CA. In an embodiment, the plurality of first areas A1 may extend in a direction crossing the first direction (e.g., an x-direction or –x-direction) and the second direction (e.g., a y-direction or –y-direction), e.g., inclined with respect to the first and second directions.

The second area A2 may surround the first area A1. The second area A2 may surround the plurality of first areas A1. In an embodiment, the central corner area CCA may include a plurality of second areas A2. In an embodiment, a separation area VA may be defined between a first portion of the second area A2 disposed between first adjacent areas A1 and a second portion of the second areas A2 disposed between the first adjacent areas A1. That is, the second areas A2 which are adjacent to each other (e.g., first and second portions of the second area A2), may be spaced apart from each other to define the separation area VA. The separation area VA may have a wedge shape, owing to the gap between the second areas A2 which are adjacent to each other.

The separation area VA may be an area in which components of the display panel 10 are not arranged. When the central corner area CCA is bent at the corner CN, a larger compressive strain than a tensile strain may be generated in the central corner area CCA. In the present embodiment, since the separation area VA is defined between a first portion of the second area A2 between a pair of first areas A1 adjacent to each other and a second portion of the second area A2 between the pair of first adjacent areas A1 the central corner area CCA may be contracted. Thus, the display panel 10 may be bent at the central corner area CCA without damage.

A first adjacent corner area ACAI may be adjacent to the central corner area CCA. In an embodiment, at least a portion of the first side area SA1 and the first adjacent corner area ACA1 may be arranged in the first direction (e.g., an x-direction or –x-direction). An end of the central corner area CCA which is furthest from the central area CA, and an end of the first adjacent corner area ACA1 which is furthest from the central area CA, may be spaced apart from each other along an outer edge of the display panel 10. The first adjacent corner area ACA1 may be bent in a cross section (e.g., an xz cross section) in the first direction (e.g., an x-direction or −x-direction) and may not be bent in a cross section (e.g., an xz cross section) in the second direction (e.g., a y-direction or −y-direction), and the separation area VA may not be defined in the first adjacent corner area ACA1.

A second adjacent corner area ACA2 may be adjacent to the central corner area CCA. At least a portion of the second side area SA2 may be arranged between the central area CA and the second adjacent corner area ACA2 in the second direction (e.g., a y-direction or −y-direction). An end of the central corner area CCA which is furthest from the central area CA, and an end of the second adjacent corner area ACA2 which is furthest from the central area CA, may be spaced apart from each other. The second adjacent corner area ACA2 may not be bent in a cross section (e.g., an xz cross section) in the first direction (e.g., an x-direction or −x-direction) and may be bent in a cross section (e.g., an yz cross section) in the second direction (e.g., a y-direction or −y-direction), and the separation area VA may not be defined in the second adjacent corner area ACA2.

The middle area MA may be between the central area CA and the corner area CNA. The middle area MA may extend between the corner area CNA and the first side area SA1. The middle area MA may extend between the corner area CNA and the second side area SA2. A driving circuit DC for providing an electrical signal to the pixel PX and/or a power wiring for providing power may be arranged in the middle area MA. In this case, the pixel PX arranged in the middle area MA may overlap the driving circuit DC and/or the power wiring. In embodiments, the driving circuit DC arranged in the middle area MA may be omitted.

The pixel PX may be arranged in at least one of the central area CA, the first side area SA1, the second side area SA2, the first area A1 of the corner area CNA, and the middle area MA. In an embodiment, the plurality of pixels PX may be arranged in the central area CA, the first side area SA1, the second side area SA2, the first area A1 of the corner area CNA, and the middle area MA. Thus, the display panel 10 may display an image in the central area CA, the first side area SA1, the second side area SA2, the first area A1 of the corner area CNA, and the middle area MA. The plurality of pixels PX may include a plurality of display elements. In an embodiment, the pixel PX overlapping the first area A1 of the corner area CNA may include a corner organic light emitting diode CNOLED as a corner display element. The pixel PX overlapping the middle area MA may include a middle organic light emitting diode MEWLED as a middle display element. The pixel PX overlapping the central area CA may include a central organic light emitting diode COLED as a central display element.

Figure 6:
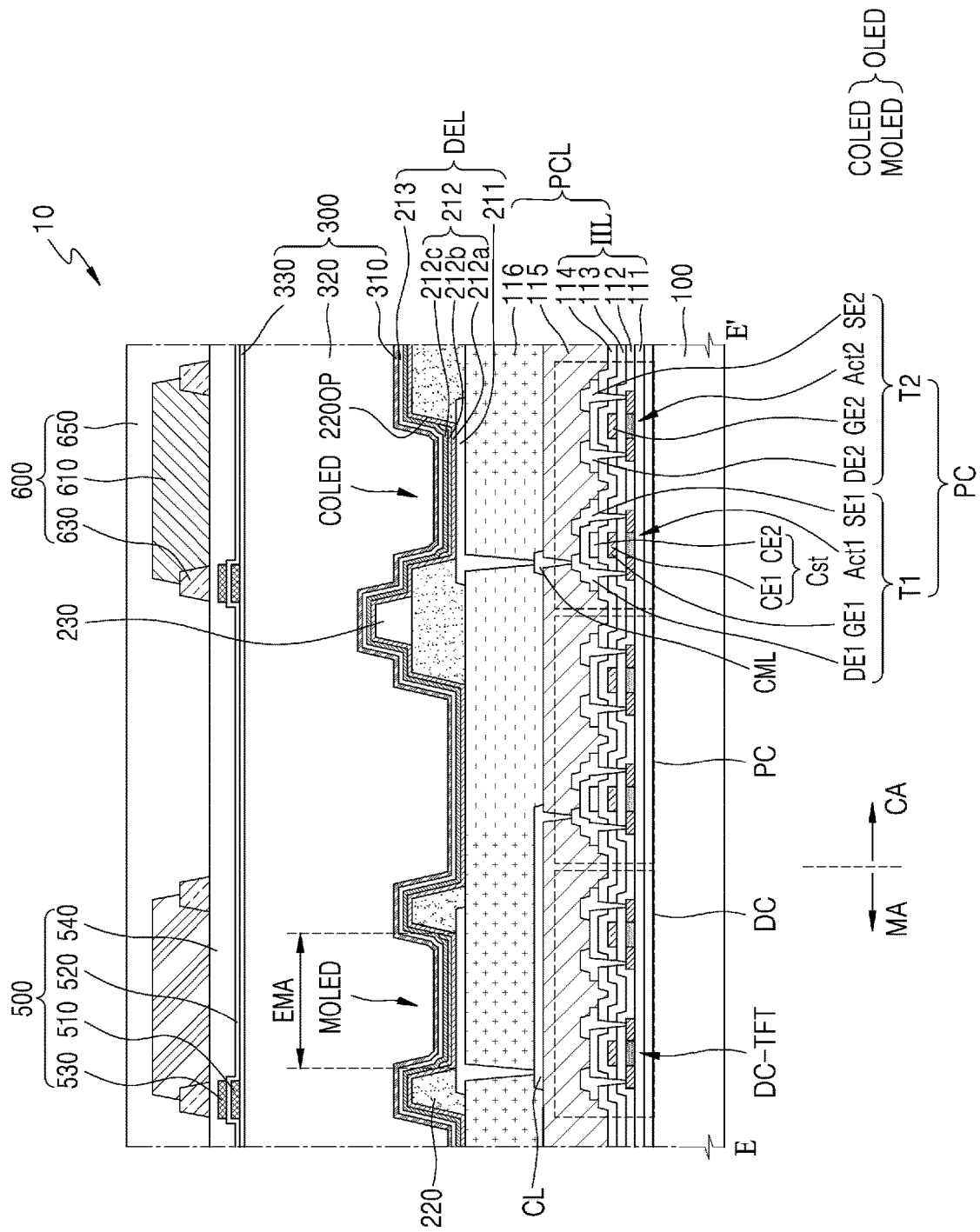
FIG. 6 is a cross-sectional view schematically illustrating a display panel according to an embodiment, taken along line E-E' of FIG. 5.

FIG. 6 is a cross-sectional view schematically illustrating a display panel 10 according to an embodiment, taken along line E-E' of FIG. 5.

Referring to FIG. 6, the display panel 10 may include a substrate 100, a pixel circuit layer PCL, a display element layer DEL, an encapsulation layer 300, a touch sensor layer 500, and an anti-reflection layer 600.

The substrate 100 may include various materials, such as a glass, a metal or an organic material. In an alternative embodiment, the substrate 100 may include a flexible material. In an embodiment, for example, the substrate 100 may include an ultra-thin flexible glass (e.g., a thickness of several tens to several hundreds of micrometers (μm)) or a polymer resin. When the substrate 100 includes a polymer resin, the substrate 100 may include polyimide (PI). Alternatively, the substrate 100 may include polyethersulfone, polyarylate, polyetherimide, polyethyelenene napthalate, polyethyleneterephthalate, polyphenylene sulfide, polycarbonate, cellulose tri-acetate (TAC), or/and cellulose acetate propionate.

In an embodiment, the substrate 100 may include a single layer or multi-layered inorganic barrier layer including silicon nitride ($SiN_x$), silicon oxide ($SiO_2$), and/or silicon oxynitride (SiON) in order to prevent penetration of external foreign materials.

The pixel circuit layer PCL may be arranged on the substrate 100. The pixel circuit layer PCL may include a driving circuit DC and a pixel circuit PC. In an embodiment, the driving circuit DC may be arranged in the middle area MA, In an embodiment, the driving circuit DC may not be arranged in the middle area MA. In this case, the driving circuit DC may be arranged in a peripheral area PA. Hereinafter, a case where the driving circuit DC is arranged in the middle area MA, will be described in detail.

The peripheral area PA may be arranged in the central area CA. In an embodiment, the pixel circuit PC may be spaced apart from the middle area MA. In other words, the pixel circuit PC may not overlap the middle area MA. In an embodiment, the pixel circuit PC may overlap the middle area MA.

The driving circuit DC may include a driving circuit thin film transistor DC-TFT. In an embodiment, the driving circuit DC may be connected to a scan fine SL. The pixel circuit PC may include at least one thin film transistor. In an embodiment, the pixel circuit PC may include a driving thin film transistor T1, a switching thin film transistor T2, and a storage capacitor Cst.

The pixel circuit layer PCL may further include an inorganic insulating layer HL, a first insulating layer 115, and a second insulating layer 116, which are arranged under or/on components of the driving thin film transistor T1. The inorganic insulating layer IIL may include a buffer layer 111, a first gate insulating layer 112, a second gate insulating layer 113, and an interlayer insulating layer 114. The driving thin film transistor T1 may include a first semiconductor layer Act1, a first gate electrode GE1, a first source electrode SE1, and a first drain electrode DE1.

The buffer layer 111 may be arranged on the substrate 100. The buffer layer 111 may include an inorganic insulating material such as silicon nitride ($SiN_x$), silicon oxynitride (SIGN), and silicon oxide ($SiO_2$), and may have a single layer or multi-layered structure including the above-described inorganic insulating material.

The first semiconductor layer Act1 may be arranged on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and a drain region and a source region on both sides of the channel region, respectively.

A first gate electrode GE1 may overlap the channel region. The first gate electrode GE1 may include a low resistance metal material. The first gate electrode GE1 may include a conductive material including molybdenum (Mo), aluminum (Al), copper (Cu), titanium (Ti), and the like, and may have a mufti-layered or single layer structure including the above-described materials.

The first gate insulating layer 112 between the first semiconductor layer Act1 and the first gate electrode GE1 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO$_x$). In an embodiment, the zinc oxide (ZnO$_x$) may include zinc oxide (ZnO) and/or zinc peroxide (ZnO$_2$).

The second gate insulating layer 113 may cover the first gate electrode GE1. The second gate insulating layer 113 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO$_x$), similarly to the first gate insulating layer 112.

An upper electrode CE2 of the storage capacitor Cst may be arranged on the second gate insulating layer 113. The upper electrode CE2 may overlap the first gate electrode GE1 thereunder. In this case, the first gate electrode GE1 and the upper electrode CE2 of the driving thin film transistor T1 that overlap each other with the second gate insulating layer 113 therebetween may constitute the storage capacitor Cst. That is, the first gate electrode GE1 of the driving thin film transistor T1 may function as the lower electrode CE1 of the storage capacitor Cst. In other words, the storage capacitor Cst and the driving thin film transistor T1 may overlap each other. In embodiments, the storage capacitor Cst may not overlap the driving thin film transistor T1. The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single layer or multi-layered structure of the above-described materials.

The interlayer insulating layer 114 may cover the upper electrode CE2. The interlayer insulating layer 114 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_x$). The interlayer insulating layer 114 may have a single layer or multi-layered structure including the above-described inorganic insulating materials.

Each of the first drain electrode DE1 and the first source electrode SE1 may be arranged on the interlayer insulating layer 114. The first drain electrode DE1 and the first source electrode SE1 may include a conductive material. The first drain electrode DE1 and the first source electrode SE1 may include a conductive material including Mo, Al, Cu, Ti, and the like, and may have a multi-layered or single layer structure including the above-described materials. In an embodiment, the first drain electrode DE1 and the first source electrode SE1 may have a multi-layered structure of Ti/Al/Ti.

The switching thin film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, and thus, a detailed description thereof will be omitted.

The driving circuit thin film transistor DC-TFT may include a driving circuit semiconductor layer, a driving circuit gate electrode, a driving circuit source electrode, and a driving circuit drain electrode, similarly to the switching thin film transistor T2.

The first insulating layer 115 may be arranged on at least one thin film transistor. In an embodiment, the first insulating layer 115 may be arranged to cover the first drain electrode DE1 and the first source electrode SE1. The first insulating layer 115 may include an organic material. In an embodiment, for example, the first insulating layer 115 may include an organic insulating material such as a general-purpose polymer such as polymethylmethacrylate (PMMA) or polystyrene (PS), a polymer derivative having a phenol-based group, an acryl-based polymer, an imide polymer, an aryl ether-based polymer, an amide polymer, a fluorine-based polymer, a p-xylene-based polymer, a vinyl alcohol-based polymer, and a blend thereof.

A connection electrode CML and a connection line CL may be arranged on the first insulating layer 115. In this case, each of the connection electrode CML and the connection line CL may be connected to the first drain electrode DE1 or the first source electrode SE1 through a contact hole of the first insulating layer 115. The connection electrode CML and the connection line CL may include a conductive material. The connection electrode CML and the connection line CL may include a conductive material including Mo, Al, Cu, Ti, or the like, and may have a multi-layered or single layer including the above-described materials. In an embodiment, the connection electrode CML and the connection line CL may have a multi-layered structure of Ti/Al/Ti.

In an embodiment, the connection line CL may extend from the central area CA and to the middle area MA. In an embodiment, the connection line CL may extend from a peripheral area PA (of FIG. 3) or a corner area CNA (of FIG. 3), and to the middle area MA. In an embodiment, the connection line CL may extend from a first side area SA1 (of FIG. 3) or a second side area SA2 (of FIG. 3), and into the middle area MA. The connection line CL may overlap the driving circuit thin film transistor DC-TFT.

The second insulating layer 116 may be arranged to cover the connection electrode CML and the connection line CL. The second insulating layer 116 may include an organic material. The second insulating layer 116 may include an organic insulating material such as a general-purpose polymer such as PMMA or PS, a polymer derivative having a phenol-based group, an acryl-based polymer, an imide polymer, an aryl ether-based polymer, an amide polymer, a fluorine-based polymer, a p-xylene-based polymer, a vinyl alcohol-based polymer, and a blend thereof.

The display element layer DEL may be arranged on the pixel circuit layer PCL. The display element layer DEL that includes a display element IPE, may include an organic light emitting diode OLED, a pixel-defining layer 220, and a spacer 230. The display element layer DEL may include a plurality of organic light emitting diodes OLED. In an embodiment, one of the plurality of organic light emitting diodes OLED that is a central display element may be a central organic light emitting diode COLED arranged in the central area CA, Another one of the plurality of organic light emitting diodes OLED that is a middle display element may be a middle organic light emitting diode MOLED arranged in the middle area MA. In this case, the middle organic light emitting diode MOLED arranged in the middle area MA may overlap the driving circuit DC. Thus, in the present embodiment, the display panel 10 may display an image in the middle area MA in which the driving circuit DC is arranged.

The central organic light emitting diode COLED may be electrically connected to the connection electrode CML through (or at) a contact hole defined in (or by) the second insulating layer 116. The middle organic light emitting diode MOLED may be electrically connected to the connection line CL through the contact hole of the second insulating layer 116. The organic light emitting diode OLED may include a first electrode 211, an intermediate layer 212, and a second electrode 213.

The first electrode 211 may be arranged on the second insulating layer 116. The first electrode 211 may be electrically connected to the connection electrode CML or the connection line CL, through the contact hole of the second insulating layer 116. In an embodiment, the first electrode 211 may be a pixel electrode. The first electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 211 may include a reflective layer including Ag, Mg, Al, platinum (Pt), palladium (Pd), gold (Au), Ni, Nd, Ir, Cr, or a compound thereof. In an embodiment, the first electrode 211 may further include a layer formed of ITO, IZO, ZnO, or $In_2O_3$ on/under the above-described reflective layer.

The pixel-defining layer 220 which defines an opening 220OP exposing the central portion of the first electrode 211 to outside the pixel-defining layer 220, may be arranged on the first electrode 211. The opening 220OP of the pixel-defining layer 220 may define a light emission area of light emitted from the organic light emitting diode OLED (hereinafter, referred to as an emission area EMA).

Various elements such as the opening 220OP, the emission area EMA, a sub-pixel, etc. may have a width defined in a direction along the substrate 100. As used herein, a width of an element may be a minimum dimension along an underlying layer such as the substrate 100, without being limited thereto. In an embodiment, for example, the width of the opening 220OP of the pixel-defining layer 220 may correspond to the width of the emission area EMA. In addition, the width of the opening 220OP of the pixel-defining layer 220 may correspond to the width of a sub-pixel.

In an embodiment, the pixel-defining layer 220 may include an organic insulating material. In an embodiment, the pixel-defining layer 220 may include an inorganic insulating material such as silicon nitride ($SiN_x$), silicon oxynitride (SiON), or silicon oxide ($SiO_2$). In an embodiment, the pixel-defining layer 220 may include an organic insulating material and an inorganic insulating material. In embodiments, the pixel-defining layer 220 may include a light-blocking material and may be provided in black. The light-blocking material may include carbon black, carbon nanotubes, a resin or paste including a black dye, metal particles, such as nickel, aluminum, molybdenum, and an alloy thereof, metal oxide particles (e.g., chromium oxide), or metal nitride particles (e.g., chromium nitride). When the pixel-defining layer 220 includes a light-blocking material, reflection of external light due to metal structures arranged under the pixel-defining layer 220 may be reduced.

The spacer 230 may be arranged on the pixel-defining layer 220. The spacer 230 may be configured to prevent damage of the substrate 100 and/or a multi-layer on the substrate 100 in a method of manufacturing (or providing) a display device 1, In the case of a method of manufacturing a display panel 10, a mask sheet may be used, where the mask sheet may enter or sag into the opening 220OP of the pixel-defining layer 220, or may be in close contact with the pixel-defining layer 220. The spacer 230 may prevent or reduce defects in which a portion of the substrate 100 and the mufti-layer may be damage or broken by the mask sheet when a deposition material is deposited on the substrate 100 using such mask sheet.

The spacer 230 may include an organic material such as PI. Alternatively, the spacer 230 may include an inorganic insulating material such as silicon nitride ($SiN_x$) or silicon oxide ($SiO_2$), or both an organic insulating material and an inorganic insulating material. In an embodiment, the spacer 230 may include a different material from that of the pixel-defining layer 220. Alternatively, in an embodiment, the spacer 230 may include the same material as that of the pixel-defining layer 220. In this case, the pixel-defining layer 220 and the spacer 230 may be formed together in a mask process using a halftone mask or the like. As being formed together in a same process, elements may include a same material, be in a same layer as each other as respective portions of a same material layer, may be on a same layer by forming an interface with a same underlying or overlying layer, etc., without being limited thereto.

The intermediate layer 212 may be arranged on the pixel-defining layer 220. The intermediate layer 212 may include a light emitting layer 212b arranged to correspond to the opening 220OP of the pixel-defining layer 220. The light emitting layer 212b may include a polymer or small molecular organic material that emits a certain color of light.

The intermediate layer 212 may include at least one of a first functional layer 212a between the first electrode 211 and the light emitting layer 212b, and a second functional layer 212c between the light emitting layer 212b and the second electrode 213. In an embodiment, the first functional layer 212a and the second functional layer 212c may be arranged under and above the light emitting layer 212b, respectively. The first functional layer 212a may include a hole transport layer (HTL), for example, or a hole transport layer and a hole injection layer (HIL). The second functional layer 212c may include an electron transport layer (ETL) and/or an electron injection layer (EIL). The first functional layer 212a and/or the second functional layer 212c may be a common layer formed to cover an entirety of the substrate 100, like in the second electrode 213 to be described later.

The second electrode 213 may be arranged on the intermediate layer 212. In an embodiment, the second electrode 213 may be an opposite electrode. The second electrode 213 may include a conductive material having a small work function. In an embodiment, for example, the second electrode 213 may include a (semi-)transparent layer including Ag, Mg, Al, Pt, Pd, Au, Ni, Nd, Ir, Cr, lithium (Li), calcium (Ca), or an alloy thereof. Alternatively, the second electrode 213 may further include a layer such as ITO, IZO, ZnO or $In_2O_3$ on the (semi-)transparent layer including the above-described materials.

In embodiments, a capping layer (not shown) may be further disposed on the second electrode 213. The capping layer may include LiF, an inorganic material, or/and an organic material.

The encapsulation layer 300 may be arranged on the second electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked on each other.

The first inorganic encapsulation layer 310 and the second inorganic encapsulation layer 330 may include one or more inorganic materials of aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SiON). The organic encapsulation layer 320 may include a polymer-based material. The polymer-based material may include an acryl-based resin, an epoxy-based resin, PI, polyethylene, or the like In an embodiment, the organic encapsulation layer 320 may include acrylate.

The touch sensor layer 500 may be arranged on the encapsulation layer 300. The touch sensor layer 500 may acquire coordinate information according to an external input, for example, a touch event, a proximity event, a light event, etc. The touch sensor layer 500 may include a first touch conductive layer 510, a first touch insulating layer 520, a second touch conductive layer 530, and a second touch insulating layer 540.

The first touch conductive layer 510 may be arranged on the second inorganic encapsulation layer 330. The first touch conductive layer 510 may include a conductive material. In an embodiment, for example, the first touch conductive layer 510 may include at least one of Mo, Al, Cu, and Ti. In an embodiment, the first touch conductive layer 510 may have a multi-layered structure of Ti/Al/Ti in which a titanium layer, an aluminum layer and a titanium layer are sequentially stacked on each other.

The first touch insulating layer 520 may be arranged on the first touch conductive layer 510. In an embodiment, the first touch insulating layer 520 may include an inorganic material. In an embodiment, for example, the first touch insulating layer 520 may include one or more inorganic materials of aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SiON).

The second touch conductive layer 530 may be arranged on the first touch insulating layer 520. In an embodiment, the first touch insulating layer 520 may include (or define) a contact hole, and the second touch conductive layer 530 may be connected to the first touch conductive layer 510 through the contact hole. The second touch conductive layer 530 may include a conductive material. In an embodiment, for example, the second touch conductive layer 530 may include at least one of Mo, Al, Cu, and Ti. In an embodiment, the second touch conductive layer 530 may have a multi-layered structure of Ti/Al/Ti in which a titanium layer, an aluminum layer and a titanium layer are sequentially stacked on each other.

The second touch insulating layer 540 may be arranged on the second touch conductive layer 530. In an embodiment, the top surface of the second touch insulating layer 540 may be flat. In an embodiment, the second touch insulating layer 540 may include an organic material. In an embodiment, for example, the second touch insulating layer 540 may include a polymer-based material. The polymer-based material described above may be transparent. In an embodiment, for example, the second touch insulating layer 540 may include silicon-based resin, acryl-based resin, epoxy-based resin, polyimide, polyethylene, and the like. In an embodiment, the second touch insulating layer 540 may include an inorganic material.

An anti-reflection layer 600 may reduce the reflectivity of light incident toward the display panel 10 from outside the display panel 10. The anti-reflection layer 600 may increase color purity of light emitted from the display panel 10. The anti-reflection layer 600 may be arranged on the touch sensor layer 500. In an embodiment, the anti-reflection layer 600 may include a color filter 610, a black matrix 630, and a planarization layer 650. The color filter 610 may overlap the organic light emitting diode OLED that is a display element DPE. The color filter 610 may be arranged considering colors of light emitted from the organic light emitting diode OLED. The color filter 610 may include a red, green or blue pigment or dye. Alternatively, the color filter 610 may further include quantum dots in addition to the above-described pigment or dye. Alternatively, the color filter 610 may not include the above-described pigment or dye and may include scattering particles such as titanium oxide.

The black matrix 630 may absorb external light or internal reflected light at least partially. The black matrix 630 may include a black pigment. In an embodiment, the black matrix 630 may be adjacent to the color filter 610. In an embodiment, the black matrix 630 may overlap at least one of the first touch conductive layer 510 and/or the second touch conductive layer 530.

The planarization layer 650 may be arranged on the color filter 610 and the black matrix 630, The top surface of the planarization layer 650 may be flat. In an embodiment, the planarization layer 650 may include an organic material. In an embodiment, for example, the planarization layer 650 may include a polymer-based material. The polymer-based material described above may be transparent. In an embodiment, for example, the planarization layer 650 may include silicon-based resin, acryl-based resin, epoxy-based resin, polyimide, polyethylene, and the like.

In an embodiment, the anti-reflection layer 600 may include a retarder and/or a polarizer. The retarder may be of a film type or a liquid crystal coating type and may include a $\lambda/2$ retarder and/or $\lambda/4$ retarder. The polarizer may also be of a film type or a liquid crystal coating type. The film type may include a stretched synthetic resin film, and the liquid crystal coating type may include liquid crystals arranged in a certain arrangement. The retarder and the polarizer may further include a protective film.

In an embodiment, the anti-reflection layer 600 may include a destructive interference structure. The destructive interference structure may include a first reflective layer and a second reflective layer, which are arranged on different layers. First reflected light and second reflected light, which are reflected from the first reflective layer and the second reflective layer, respectively, may destructively interfere, and accordingly, external light reflectivity may be reduced.

Figure 7:
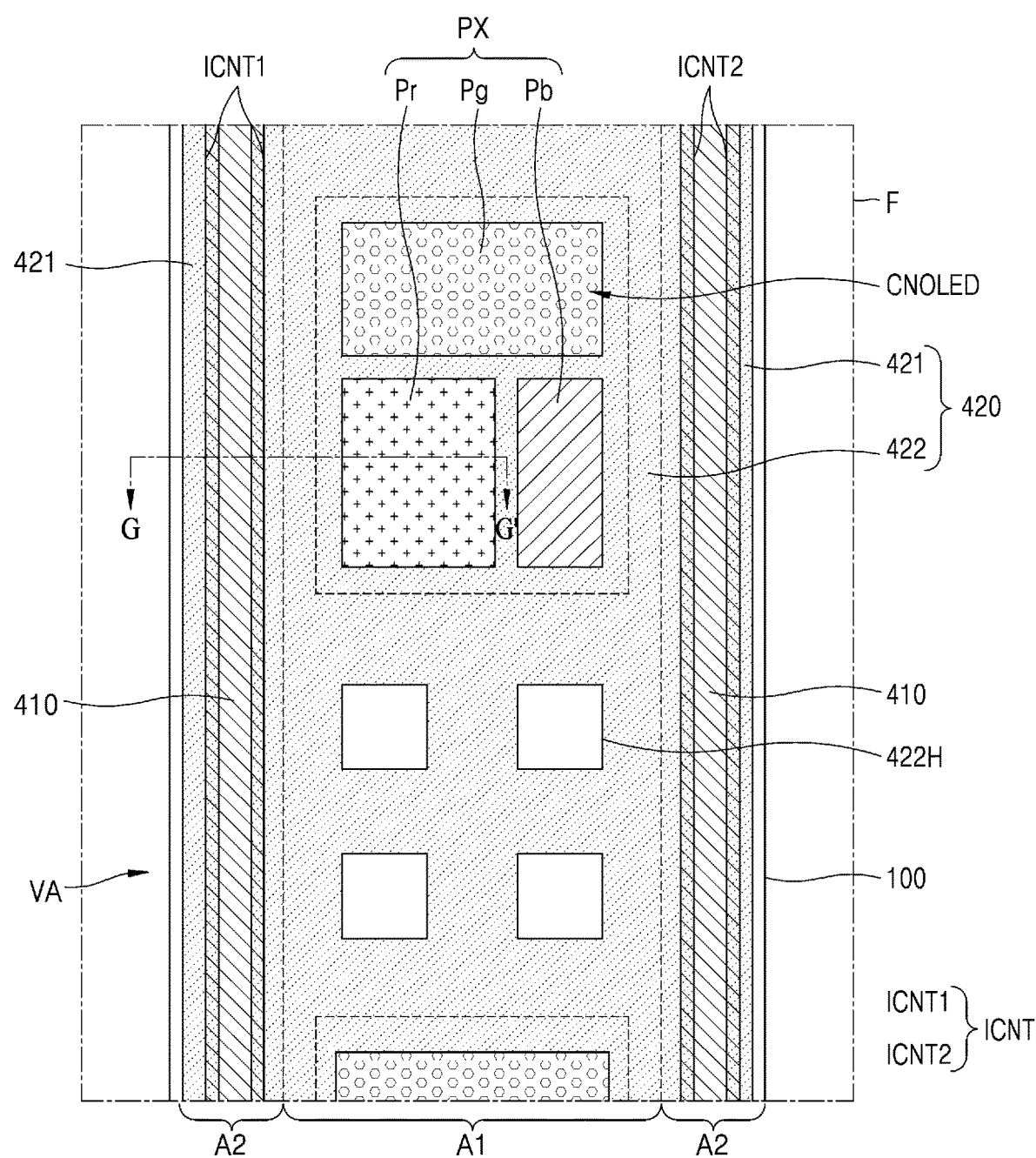
FIG. 7 is an enlarged view of portion F of the display panel of FIG. 5.
Figure 8A:
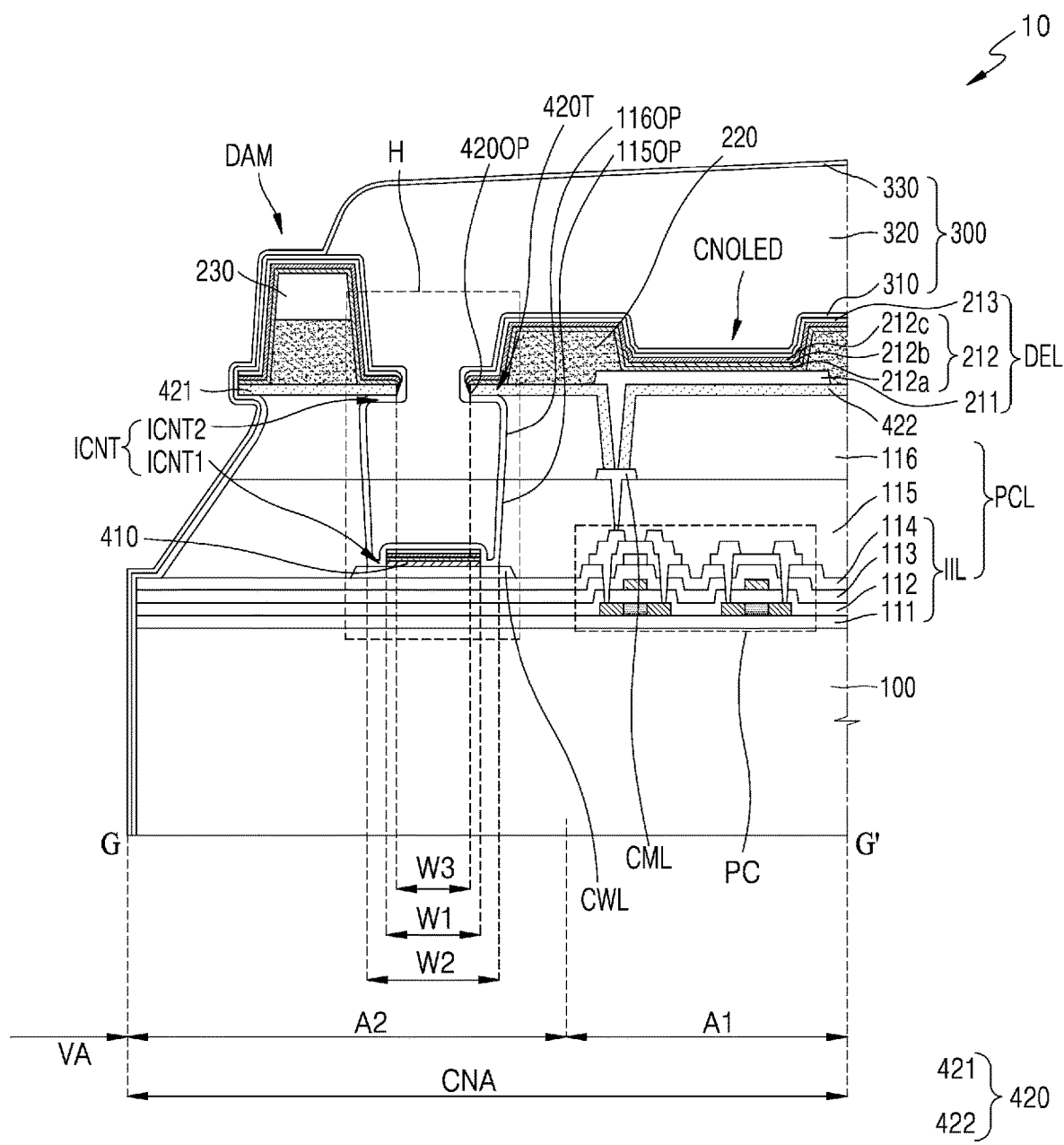
FIGS. 8A and 8B are cross-sectional views schematically illustrating a display panel according to an embodiment, taken along line G-G' of FIG. 5.
Figure 8B:
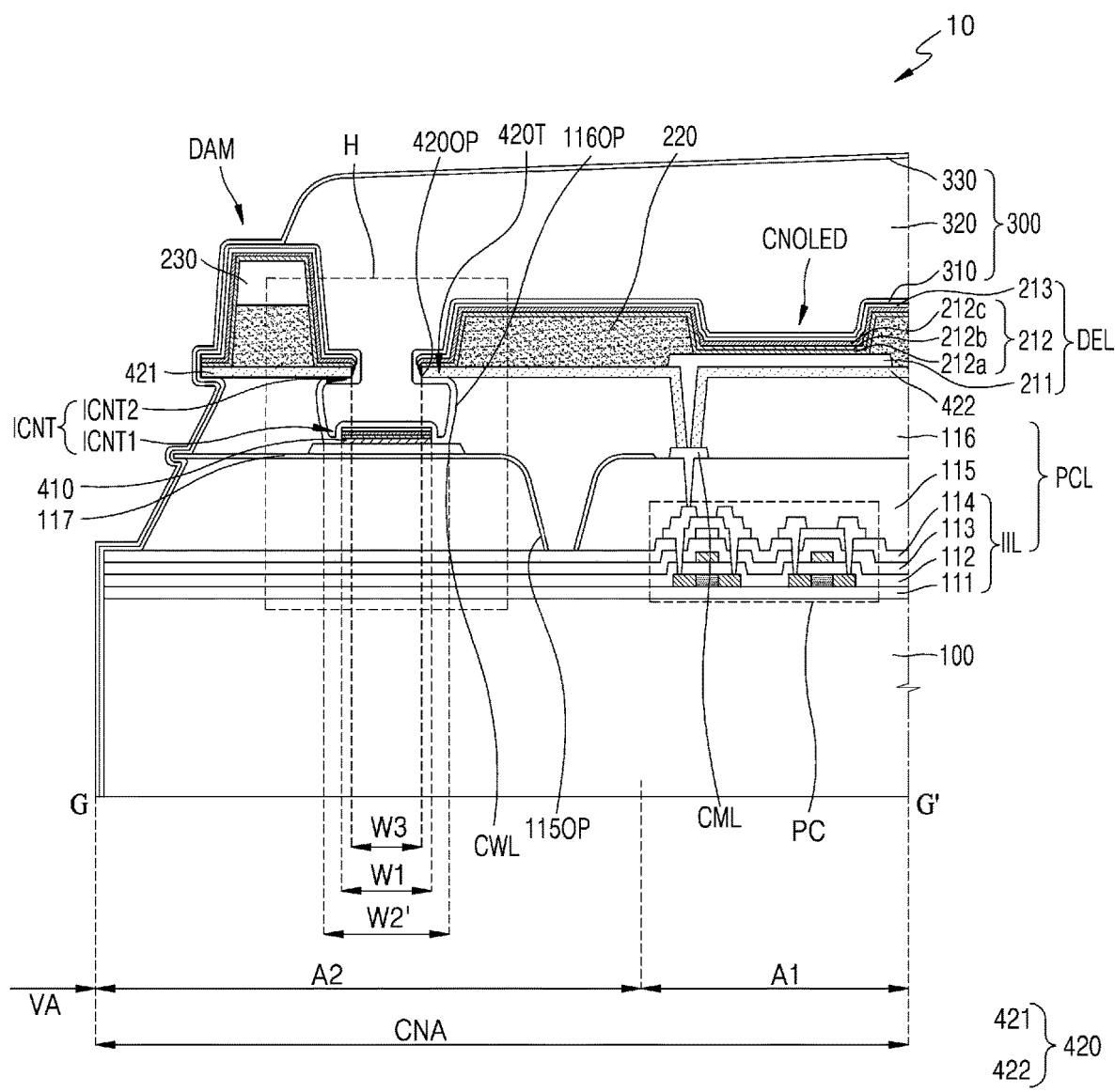

FIG. 7 is an enlarged view of a portion F of the display panel 10 of FIG. 5. FIGS. 8A and 8B are cross-sectional views schematically illustrating a display panel 10 according to embodiments, taken along line G-G' of FIG. 5, respectively.

In FIGS. 8A and 8B, for convenience of explanation, a touch sensor layer 500 (of FIG. 6) and an anti-reflection layer 600 (of FIG. 6) of the display panel 10 are omitted, and a substrate 100, a pixel circuit layer PCL, a display element layer DEL, and an encapsulation layer 300 are shown in FIGS. 8A and 8B. In FIG. 7 and FIGS. 8A and 8B, the same reference numerals as those of FIG. 6 refer to the same elements and thus, a redundant description thereof will be omitted.

Referring to FIG. 7 and FIGS. 8A and 8B, the display panel 10 may include the substrate 100, the pixel circuit layer PCL, the display element layer DEL, and the encapsulation layer 300.

The substrate 100 may include a corner area CNA at a corner CN of the display panel 10, and the corner area CNA may include a first area A1 extending in a direction away from a central area CA (of FIG. 5), and a second area A2 surrounding at least a portion of the first area A1. In an embodiment, for example, a plurality of first areas A1 may be provided and may each extend inclined in a direction crossing the first direction (e.g., an x-direction or –x-direction) and the second direction (e.g., a y-direction or –y-direction). The second area A2 may extend from an outer edge of the first area A1, to be outside of the first area A1 and may surround at least a portion of the first area A1.

The separation area VA may be an area (e.g., planar area) in which components of the display panel 10 are not arranged. In an embodiment, the separation area VA may be defined between a portion of the second area A2 disposed between a pair of the first adjacent areas A1 and another portion of the second area A2 disposed between the pair of the first adjacent areas A1.

The pixel PX may be arranged in the first area A1. In an embodiment, the pixel PX may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively.

The red sub-pixel Pr, the green sub-pixel Pg, and the blue sub-pixel Pb may be arranged in an S-stripe structure. In an embodiment, a side of the green sub-pixel Pg may face both a side of the red sub-pixel Pr and a side of the blue sub-pixel Pb. Alternatively, unlike the illustrated drawings, the red sub-pixel Pr, the green sub-pixel Pg, and the blue sub-pixel Pb may be arranged side by side, or may be arranged in a PenTile™ type.

The pixel circuit layer PCL may be arranged on the substrate 100. The pixel circuit layer PCL may include an inorganic insulating layer HL, a first insulating layer 115, a corner wiring CWL, a connection electrode CML, and a second insulating layer 116.

The inorganic insulating layer IIL may be arranged on the substrate 100. In an embodiment, the inorganic insulating layer IIL may include a buffer layer 111, a first gate insulating layer 112, a second gate insulating layer 113, and an interlayer insulating layer 114.

The first insulating layer 115 may be arranged on the inorganic insulating layer IIL. In an embodiment, the first insulating layer 115 may be arranged between the substrate 100 and the second insulating layer 116. The first insulating layer 115 may overlap the second area A2 and may have a through portion 115OP for exposing the top surface of the inorganic insulating layer IIL, to outside the first insulating layer 115. Based on the through portion 115OP, the first insulating layer 115 may be divided into an outside portion and an inside portion which is closer to the first area A1 than the outside portion, and may block a penetration path of oxygen and/or moisture through the first insulating layer 115.

The second insulating layer 116 may be arranged on the first insulating layer 115. The second insulating layer 116 may have a first opening 116OP that overlaps the second area A2, In an embodiment, for example, the first opening 116OP of the second insulating layer 116 may be continuously arranged to surround at least a portion of the first area A1. As shown in FIG. 8A, the through portion 115OP of the first insulating layer 115 and the first opening 116OP of the second insulating layer 116 may overlap (or be aligned with) each other. In an embodiment, for example, the through portion 115OP of the first insulating layer 115 and the first opening 116OP of the second insulating layer 116 may together continuously constitute one opening for exposing the top surface of the inorganic insulating layer IIL to outside the respective insulating layers.

A lower pattern 410 may overlap the second area A2 and may be arranged on the top surface of the inorganic insulating layer IIL. In an embodiment, the lower pattern 410 may perform a function as an etch stopper for protecting layers under the lower pattern 410 when the first opening 116OP and the through portion 115OP are formed. In an embodiment, a corner wiring CWL for surrounding at least a portion of the first area A1 may be optionally arranged at a bottom of the through portion 115OP (e.g., on a bottom surface provide by the top surface of the inorganic insulating layer IIL which may be considered as a part of a base layer), and the lower pattern 410 may function as a protective layer for protecting the corner wiring CWL during a process. In an embodiment, for example, the lower pattern 410 may be arranged on the corner wiring CWL to cover a portion of the corner wiring CWL.

In FIG. 8A, the lower pattern 410 is separately arranged on the corner wiring CWL. In an embodiment, the lower pattern 410 may include a conductive material, and the lower pattern 410 may also function as the corner wiring CWL.

In an embodiment, the lower pattern 410 may continuously surround at least a portion of the first area A1. In an embodiment, the lower pattern 410 may overlap portions of the second area A2 and the middle area MA, and may completely surround the first area A1.

At least one side surface of the lower pattern 410 may be exposed through the through portion 115OP of the first insulating layer 115 to outside thereof. In an embodiment, the center of the lower pattern 410 and the center of the through portion 115OP of the first insulating layer 115 may overlap or coincide with each other in a planar view. A second width W2 of the through portion 115OP of the first insulating layer 115 may be greater than a first width W1 of the lower pattern 410. Thus, both sides of the lower pattern 410 may be exposed at the through portion 115OP of the first insulating layer 115.

In an embodiment, as shown in FIG. 8B, an upper inorganic layer 117 may be interposed between the first insulating layer 115 and the second insulating layer 116, and the through portion 115OP of the first insulating layer 115 and the first opening 116OP of the second insulating layer 116 may not overlap each other (e.g., may be spaced apart from each other). In an embodiment, for example, the through portion 115OP of the first insulating layer 115 may be disposed closer to a boundary of the first area A1 with the second area A2, than the first opening 116OP of the second insulating layer 116. Here, the second insulating layer 116 may bury the through portion 115OP, such as filling the through portion 115OP. In this case, the upper inorganic layer 117 may cover a portion of the top surface of the first insulating layer 115 and the through portion 115OP, and may block a path on which oxygen and/or moisture penetrates into the first insulating layer 115 and the second insulating layer 116 from the outside thereof.

Referring to FIG. 83, the lower pattern 410 may be arranged on the first insulating layer 115. In an embodiment, the corner wiring CWL may be optionally arranged on the first insulating layer 115, As described above, the lower pattern 410 may be arranged on the corner wiring CWL and may function as an etch stopper for protecting the corner wiring CWL when the first opening 116OP is formed. In an embodiment, the lower pattern 410 may include a conductive material and may substitute for the corner wiring CWL.

At least one side surface of the lower pattern 410 may be exposed through the first opening 116OP of the second insulating layer 116. In an embodiment, the center of the lower pattern 410 and the center of the first opening 116OP of the second insulating layer 116 may overlap each other in a planar view, and a second width W2 of the first opening 116OP of the second insulating layer 116 may be greater than the first width W1 of the lower pattern 410. Thus, both sides of the lower pattern 410 may be exposed at the first opening 116OP of the second insulating layer 116 to outside thereof.

An upper pattern 420 may be arranged on the second insulating layer 116 and may have a tip 420T (e.g., upper tip) or protruding portion that overlaps at least one among opposing sides of the lower pattern 410 in a planar view. In an embodiment, the upper pattern 420 may include a first inorganic pattern 421 that is arranged in the second area A2 and overlaps an outer side surface of the lower pattern 410 which is furthest from the first area A1 in a planar view, and a second inorganic pattern 422 that is arranged in the first area A1 and overlaps an inner side surface of the lower pattern 410 which is closest to the first area A1 in a planar view.

The first inorganic pattern 421 may overlap the outer side surface of the lower pattern 410 in a planar view and may surround at least a portion of the lower pattern 410. In an embodiment, for example, the first inorganic pattern 421 may include a tip 420T that protrudes in a central direction (e.g., toward a center) of the lower pattern 410, and an end (e.g., distal end) of the tip 420T may be closer to the center of the lower pattern 410 than the outer side surface of the lower pattern 410. In an embodiment, an area in which the first inorganic pattern 421 and the lower pattern 410 overlap each other in a planar view, may continuously surround at least a portion of the first area A1.

The second inorganic pattern 422 may overlap the inner side surface of the lower pattern 410 in a planar view, and the lower pattern 410 may surround at least a portion of the second inorganic pattern 422. In an embodiment, for example, the second inorganic pattern 422 may include a tip 420T that protrudes in the central direction of the lower pattern 410, and the end of the tip 420T may be closer to the center of the lower pattern 410 than the outer side surface of the lower pattern 410. In an embodiment, an area in which the second inorganic pattern 422 and the lower pattern 410 overlap each other in a planar view, may continuously surround at least a portion of the first area A1.

In an embodiment, a third width W3 of the second opening 420OP arranged between the first inorganic pattern 421 and the second inorganic pattern 422 may be less than the first width W1 of the lower pattern 410 and the second width W2 of the first opening 116OP of the second insulating layer 116.

In an embodiment, the second inorganic pattern 422 may overlap the first area A1. In an embodiment, a plurality of second inorganic patterns 422 may be provided. The plurality of second inorganic patterns 422 may overlap the plurality of first areas A1, respectively. The second inorganic pattern 422 may include a through hole 422H. The through hole 422H of the second inorganic pattern 422 may be a path which is arranged under the second inorganic pattern 422 and through which gas generated from a layer including an organic material is discharged. Thus, the reliability of the display panel 10 may be enhanced. The through hole 422H of the second inorganic pattern 422 may not overlap the pixel PX. In an embodiment, a plurality of through holes 422H of the second inorganic pattern 422 may be provided. In the first area A1, the plurality of through holes 422H of the second inorganic pattern 422 may be arranged alternately with the plurality of pixels PX.

The display element layer DEL may be arranged on the second insulating layer 116. The display element layer DEL may include a corner organic light emitting diode CNOLED and a pixel-defining layer 220. The corner organic light emitting diode CNOLED may include a first electrode 211, an intermediate layer 212 including an emission layer 212b arranged to correspond to the first electrode 211, and a second electrode 213, which are sequentially stacked on each other.

The corner organic light emitting diode CNOLED may include at least one of a first functional layer 212a between the first electrode 211 and the emission layer 212b, and a second functional layer 212c between the emission layer 212b and the second electrode 213. The emission layer 212b may be disposed for each of the pixel PX corresponding to the first electrode 211 while the first functional layer 212a, the second functional layer 212c and the second electrode 213 may be integrally formed on an entirety of the surface of the substrate 100 to cover the plurality of pixels PX.

The first functional layer 212a and the second functional layer 212c may be disconnected or divided into two or more portions, based on (e.g., with respect to) the side surface of the lower pattern 410 that overlaps the upper pattern 420 in a planar view. In an embodiment, for example, the most part (e.g., a majority) of each of the first functional layer 212a and the second functional layer 212c may be located on the upper pattern 420, and small portions (e.g., a minority) of each of the first functional layer 212a and the second functional layer 212c may remain on the top surface of the lower pattern 410 and sidewalls of the first insulating layer 115 which define the through portion 115OP and sidewalls of the second insulating layer 116 which define the first opening 116OP. Here, when the first functional layer 212a and the second functional layer 212c are formed, light may be incident into the second opening 420OP between protruding tips 420T of the upper pattern 420 with a certain angle, so that the first functional layer 212a and the second functional layer 212c may not be formed along the sides of the lower pattern 410 that overlaps the upper pattern 420 in a planar view. Thus, the first functional layer 212a and the second functional layer 212c formed on the top surface of the lower pattern 410 may not be connected to the second insulating layer 116 but may instead be separated therefrom.

Similarly, the second electrode 213 may be disconnected or divided into two or more portions based on the side surface of the lower pattern 410 that overlaps the upper pattern 420 in a planar view. In an embodiment, for example, the most part of the second electrode 213 may be located on the upper pattern 420, and small portions thereof may remain on the top surface of the lower pattern 410 and the sidewalls of the first insulating layer 115 which define the through portion 115OP and sidewalls of the second insulating layer 116 which define the first opening 116OP. Similarly, the second electrode 213 may not be deposited along the side surface of the lower pattern 410 that overlaps the upper pattern 420 in a planar view.

The first functional layer 212a and the second functional layer 212c may include an organic material, and external oxygen or moisture may be introduced into the first area A1 from the second area A2 through at least one of the first functional layer 212a and the second functional layer 212c. Such oxygen or moisture may damage a display element DPE. When the upper pattern 420 has a protruding overhang structure (or an eaves structure, an undercut structure), although the first functional layer 212a and the second functional layer 212c may be divided into two or more portions based on the tip of the upper pattern 420, the first functional layer 212a and the second functional layer 212c may remain on the bottom surface and both sidewalls of the first insulating layer 115 which define the through portion 115OP. Thus, oxygen or moisture may be propagated into the second insulating layer 116 of the second area A2, the first functional layer 212a and the second functional layer 212c, and the second insulating layer 116 of the first area A1 so that the display element DPE may be damaged. Thus, the first functional layer 212a and the second functional layer 212c may be disconnected or divided into multiple portions based on the side surface of the lower pattern 410 that overlaps the upper pattern 420 in a planar view, so that the reliability of the display panel 10 may be enhanced.

A plurality of organic layers may be arranged on the first inorganic pattern 421, so that a dam may be constituted. In an embodiment, for example, a pixel-defining layer 220 may be arranged on the first inorganic pattern 421, and a spacer 230 may be optionally arranged on the pixel-defining layer 220. Although not shown, in an embodiment, the upper pattern 420 may further include at least one inorganic pattern (not shown) that is spaced apart from the outside of the first inorganic pattern 421, and similarly, a plurality of organic layers may be arranged on the at least one inorganic pattern, so that at least one auxiliary dam (not shown) may be further constituted.

An encapsulation layer 300 may be arranged on the second electrode 213. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked on each other.

Each of the first inorganic encapsulation layer 310 and the second inorganic encapsulation layer 330 may include one or more inorganic insulating materials. The inorganic insulating materials may include aluminum oxide, tantalum oxide, hafnium oxide, zinc oxide, silicon oxide, silicon nitride or/and silicon oxynitride. The organic encapsulation layer 320 may include a polymer-based material. The polymer-based material may include an acryl-based resin, an epoxy-based resin, PI, polyethylene, or the like. The acryl-based resin may include, for example, polymethylmethacrylate, polyacrylic acid, and the like.

At least one inorganic encapsulation layer of the encapsulation layer 300 may be in direct contact with the side surface of the lower pattern 410 that overlaps the bottom surface of the tip 420T of the upper pattern 420 in a planar view, so that an inorganic contact area ICNT may be formed. As described above, the first functional layer 212, the second functional layer 212c, and the second electrode 213 may not be formed on the side surface of the lower pattern 410 and the bottom surface of the tip 420T of the upper pattern 420. In contrast, the first inorganic encapsulation layer 310 formed by chemical vapor deposition (CVD) has a relatively excellent step coverage and thus may also be formed on the side surface of the lower pattern 410 and the bottom surface of the tip 420T of the upper pattern 420. In an embodiment, the first inorganic encapsulation layer 310 may be in direct contact with the side surface of the lower pattern 410 so that the first inorganic contact area ICNT1 may be formed. In addition, the first inorganic encapsulation layer 310 may be in direct contact with the bottom surface of the tip 420T of the upper pattern 420 so that a second inorganic contact area ICNT2 may be formed.

The first inorganic encapsulation layer 310 may continuously extend along sidewalls of upper layers, to cover side surfaces of the first insulating layer 115 and the second insulating layer 116 at a respective through portion and/or respective opening, and the side surface of the substrate 100 which is at a boundary between the separation area VA and the second area A2.

In an embodiment, the organic encapsulation layer 320 may be arranged only in the first area A1 of the substrate 100. That is, the end of the organic encapsulation layer 320 which is closest to the second area A2 (e.g., terminal end) may be arranged not to exceed the end of the second inorganic pattern 422. In an embodiment, the organic encapsulation layer 320 may be arranged to fill the through portion 115OP and/or the first opening 116OP. In an embodiment, for example, the end of the organic encapsulation layer 320 may be arranged on the first inorganic pattern 421.

The second inorganic encapsulation layer 330 may be arranged on the organic encapsulation layer 320. Like the first inorganic encapsulation layer 310, the second inorganic encapsulation layer 330 may continuously extend to cover side surfaces of the first insulating layer 115 and the second insulating layer 116, and the side surface of the substrate 100 at a boundary between the separation area VA and the second area A2. Thus, the first inorganic encapsulation layer 310 and the second inorganic encapsulation layer 330 may prevent moisture from being introduced thereinto in a direction of the side surface of the display panel 10 (e.g., a lateral direction or a normal direction to the side surface), for example, through side surfaces of the first functional layer 212a, the second functional layer 212c, the first insulating layer 115, and the second insulating layer 116 which together form the side surface of the display panel 10.

FIGS. 9A through 9D are enlarged views enlarging portion H of the display panel 10 of FIG. 8.

Referring to FIG. 9, the through portion 115OP of the first insulating layer 115 and the first opening 116OP of the second insulating layer 116 may overlap each other. The through portion 115OP of the first insulating layer 115 and the first opening 116OP of the second insulating layer 116 may continuously form one opening or recess. In an embodiment, a corner wiring CWL may be selectively arranged on a top surface of the inorganic insulating layer IIL.

The lower pattern 410 may be arranged along the center of the through portion 115OP and may cover a portion of the top surface of the exposed corner wiring CWL. In an embodiment, for example, the first width W1 of the lower pattern 410 may be less than the second width W2 of the through portion 115OP so that the top surface of the corner wiring CWL or the top surface of the inorganic insulating layer IIL may be exposed by a difference between the second width W2 of the through portion 115OP and the first width W1 of the lower pattern 410.

The upper pattern 420 may be arranged on the second insulating layer 116 and may include a tip 420T that protrudes in the central direction of the first opening 116OP and the lower pattern 410. In an embodiment, the upper pattern 420 may include a first inorganic pattern 421 that overlaps the outer side surface of the lower pattern 410 in a planar view, and a second inorganic pattern 422 that overlaps the inner side surface of the lower pattern 410 in a planar view. In an embodiment, for example, the inner side surface of the first inorganic pattern 421 in a planar view may be closer to the center of the lower pattern 410 than the outer side surface of the lower pattern 410. Similarly, the outer side surface of the second inorganic pattern 422 may be closer to the center of the lower pattern 410 than the inner side surface of the lower pattern 410. Thus, the third width W3 of the second opening 420OP defined between facing tips of the first inorganic pattern 421 and the second inorganic pattern 422 may be less than the first width W1 of the lower pattern 410 and the second width W2 of the through portion 115OP.

The first functional layer 212a and the second functional layer 212c may be disconnected or divide into two or more portions based on both side surfaces of the lower pattern 410 and an end of the tip 420T (e.g., tip end) of the upper pattern 420, respectively. In an embodiment, for example, the most part of each of the first functional layer 212*a* and the second functional layer 212*c* may overlap the upper pattern 420, and small portions thereof may remain on the top surface of the lower pattern 410 and sidewalls of the first opening 116OP. Since, when the first functional layer 212*a* and the second functional layer 212*c* are deposited, light is incident onto the second opening 420OP at an angle, the first functional layer 212*a* and the second functional layer 212*c* may not be formed on the side surfaces of the lower pattern 410 and the bottom surface of the tip 420T that overlap the upper pattern 420 in a planar view. Thus, the first functional layer 212*a* and the second functional layer 212*c* may be disconnected or divided into two or more portions between the sidewalls of the second insulating layer 116 that form the first opening 116OP.

Similarly, the second electrode 213 may not be deposited on the side surface of the lower pattern 410 and the bottom surface of the tip 420T that overlap the upper pattern 420 in a planar view. Thus, the second electrode 213 may be disconnected or divided into two or more portions based on both side surfaces of the lower pattern 410 and the end of the tip 420T of the upper pattern 420, respectively.

The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked on each other.

The first inorganic encapsulation layer 310 may be arranged on the second electrode 213. Since the first inorganic encapsulation layer 310 has a relatively high step coverage compared to the first functional 212*a*, the second functional 212*c* and the second electrode 213, the first inorganic encapsulation layer 310 may extend to the side surfaces of the lower pattern 410 and along the bottom surface of the tip 420T of the upper pattern 420 and may be continuously arranged. Thus, the first inorganic encapsulation layer 310 may be in direct contact with the side surface of the lower pattern 410 so that the first inorganic contact area ICNT1 may be formed. In addition, the first inorganic encapsulation layer 310 may be in direct contact with the bottom surface of the tips 420T of the upper pattern 420 so that a second inorganic contact area ICNT2 may be formed.

Referring to FIG. 93, the through portion 115OP of the first insulating layer 115 and the first opening 116OP of the second insulating layer 116 may overlap each other so that a fourth width W4 of the through portion 115OP may be less than the second width W2 of the first opening 116OP.

At least one end of the lower pattern 410 may be exposed by the first opening 116OP and may overlap the tip 420T of the upper pattern 420 in a planar view. In an embodiment, for example, the first width W1 of the lower pattern 410 may be less than the second width W2 of the first opening 116OP and may be greater than the third width W3 of the second opening 420OP of the upper pattern 420.

An upper inorganic layer 117 may be further disposed between the first insulating Dyer 115 and the second insulating layer 116. The upper inorganic layer 117 may block a penetration path between the first insulating layer 115 and the second insulating layer 116. Also, the upper inorganic layer 117 may be in contact with the first inorganic encapsulation layer 310 and may extend to the first inorganic contact area ICNT1.

Figure 9A:
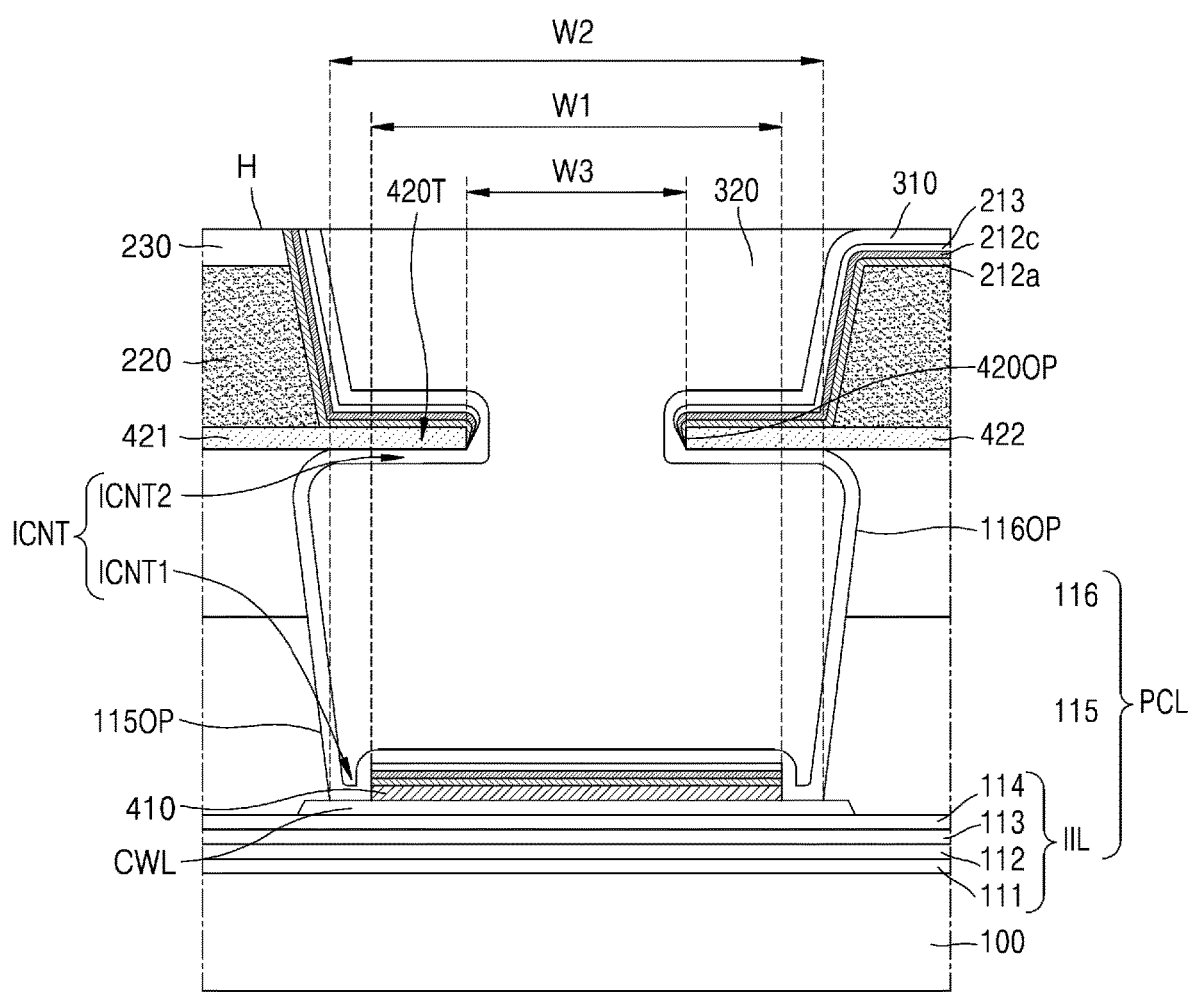
FIGS. 9A through 9D are enlarged views illustrating portion H of the display panel of FIG. 8.
Figure 9B:
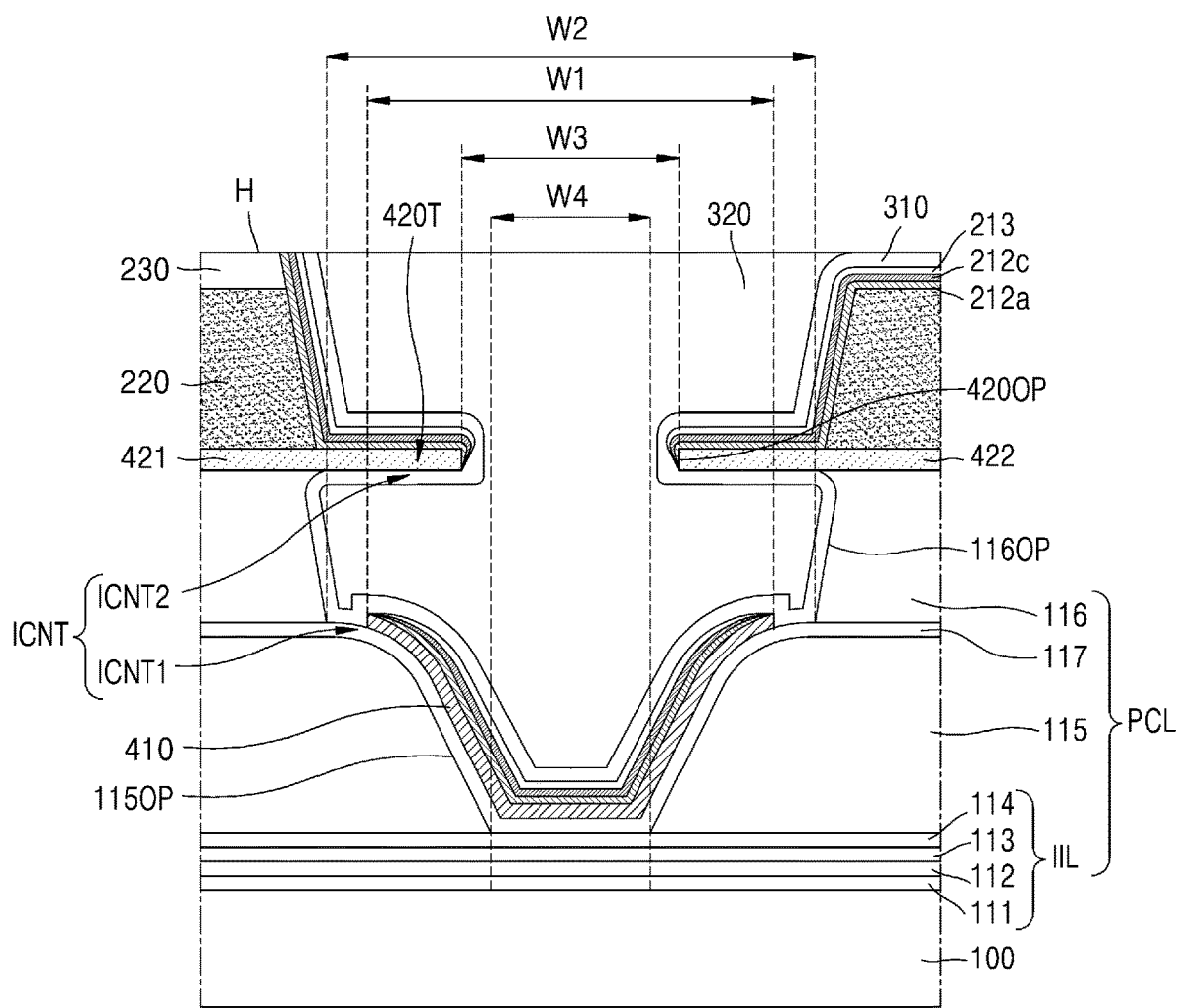
Figure 9C:
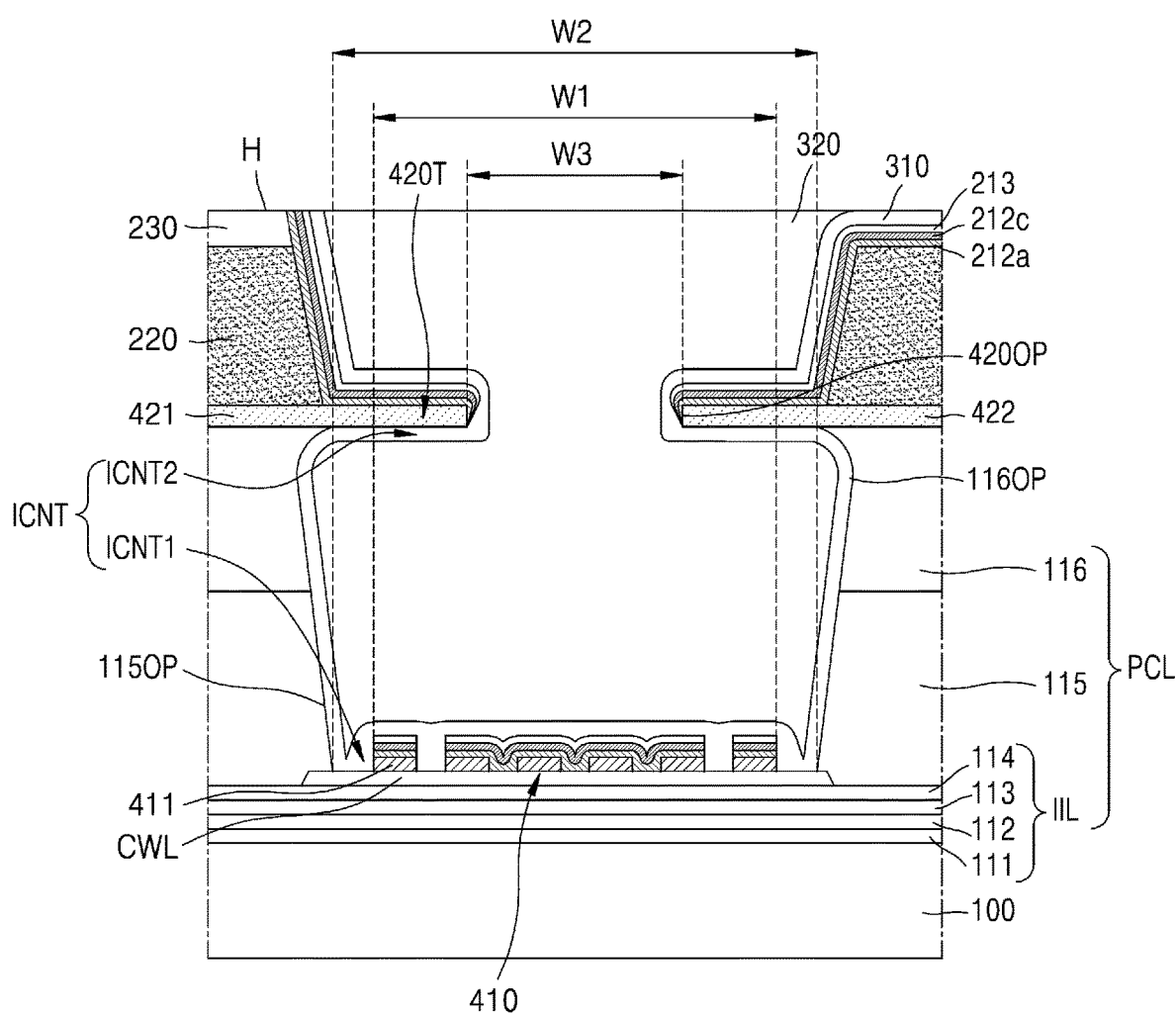

Referring to FIG. 9C, the lower pattern 410 may include a plurality of sub-patterns 411 spaced apart from each other in a direction along the substrate 100, by a distance. The plurality of sub-patterns 411 may be arranged at the bottom surface of the through portion 115OP. In an embodiment, the corner wiring CWL may be selectively arranged on the inorganic insulating layer HL, and the plurality of sub-patterns 411 may be arranged on the corner wiring CWL. In this case, the top surface of the corner wiring CWL may be exposed to outside the lower pattern 410 at a space between the adjacent sub-patterns 411.

The tip 420T of the first inorganic pattern 421 may overlap the side surface of at least one among the plurality of sub-pattern 411. In an embodiment, for example, the tip 420T of the first inorganic pattern 421 may overlap at least one sub-pattern 411 in a planar view. Similarly, the tip 420T of the second inorganic pattern 422 may overlap at least one sub-pattern 411 in a planar view.

The first functional layer 212*a* and the second functional layer 212*c* may be deposited in a space between the adjacent sub-patterns 411, however, may not be deposited on the side surface of the sub-patterns 411 overlapping the tips 420T in a planar view. Similarly, the second electrode 213 may also be deposited into the top surface of the sub-patterns 411 and a space between the adjacent sub-patterns 411, however, may not be deposited into the side surface of the sub-patterns 411 overlapping the tips 420T in a planar view.

In contrast, the first inorganic encapsulation layer 310 may be continuously formed to cover the side surface of the sub-patterns 411 that overlap the tips 420T in a planar view. In an embodiment, for example, the first inorganic encapsulation layer 310 may form the first inorganic contact area ICNT1 on side surfaces of the sub-patterns 411 that overlap the tips 420T in a planar view.

Thus, even when the alignment of the upper pattern 420 and the lower pattern 410 is shifted, the side surfaces of the sub-patterns 411 overlapping the upper pattern 420 may be present in a planar view and thus, the first inorganic contact area ICNT1 may be formed so that the reliability of the display panel 10 may be improved.

Figure 9D:
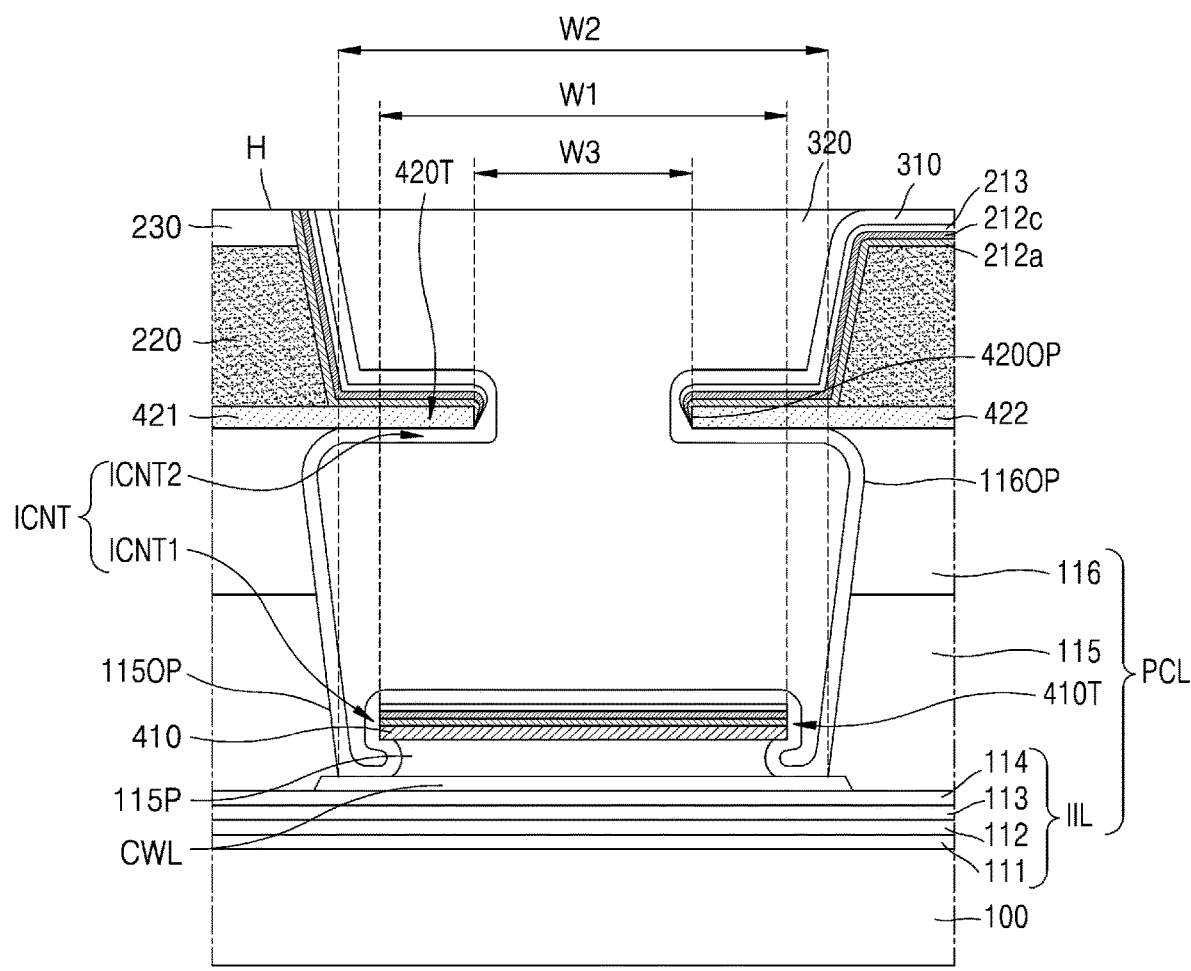

Referring to FIG. 9D, an insulating pattern 115P may be arranged at the bottom of the through portion 115OP of the first insulating layer 115. The lower pattern 410 may be arranged on the insulating pattern 115P. In an embodiment, for example, the insulating pattern 115P may be arranged along the center of the through portion 115OP, and the width of the insulating pattern 115P may be less than the second width W2 of the through portion 115OP.

The lower pattern 410 may have a lower tip 410T that protrudes in a direction away from the center of the lower pattern 410 and further than the side surface of the insulating pattern 115P. In an embodiment, for example, the width of the insulating pattern 115P may be less than the first width W1 of the lower pattern 410. That is, the lower pattern 410 may have an overhang structure in which the lower tips 410T protrude further from opposing side surfaces of the insulating pattern 115P. In an embodiment, the width of the lower pattern 410 being greater than the width of the insulating pattern 115P defines a protruding portion of the lower pattern 410 which has a protruding bottom surface exposed outside the insulating pattern 115P, an the inorganic encapsulation layer is in direct contact with the protruding bottom surface of the lower pattern 410.

The first functional layer 212*a* and the second functional layer 212*c* may be disconnected or divided into two or more portions based on both side surfaces of the lower pattern 410 and an end of the tip 420T of the upper pattern 420, respectively. In an embodiment, the first functional layer 212a and the second functional layer 212c may not be formed on both side surfaces and the bottom surface of the lower tip 410T and both side surfaces of the insulating pattern 115P. Similarly, the second electrode 213 may not be formed on both side surface of the lower pattern 410 that overlap the upper pattern 420 in a planar view, the bottom surface of the tip 420T of the upper pattern 420, the bottom surface of the lower tip 410T, and both side surfaces of the insulating pattern 115P.

The first inorganic encapsulation layer 310 may be in direct contact with both side surfaces of the lower pattern 410 and the bottom surface of the lower tip 410T so that a first inorganic contact area ICNT1 may be formed. Thus, the area of the first inorganic contact area ICNT1 may be extended. The first inorganic encapsulation layer 310 may be in direct contact with the bottom surface of the tips 420T of the upper pattern 420 so that a second inorganic contact area ICNT2 may be formed.

Figure 10A:
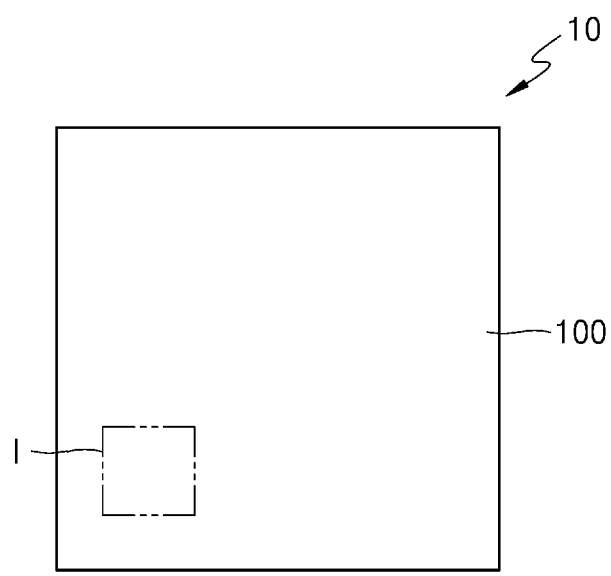
FIG. 10A is a plan view schematically illustrating a display panel according to an embodiment.
Figure 10B:
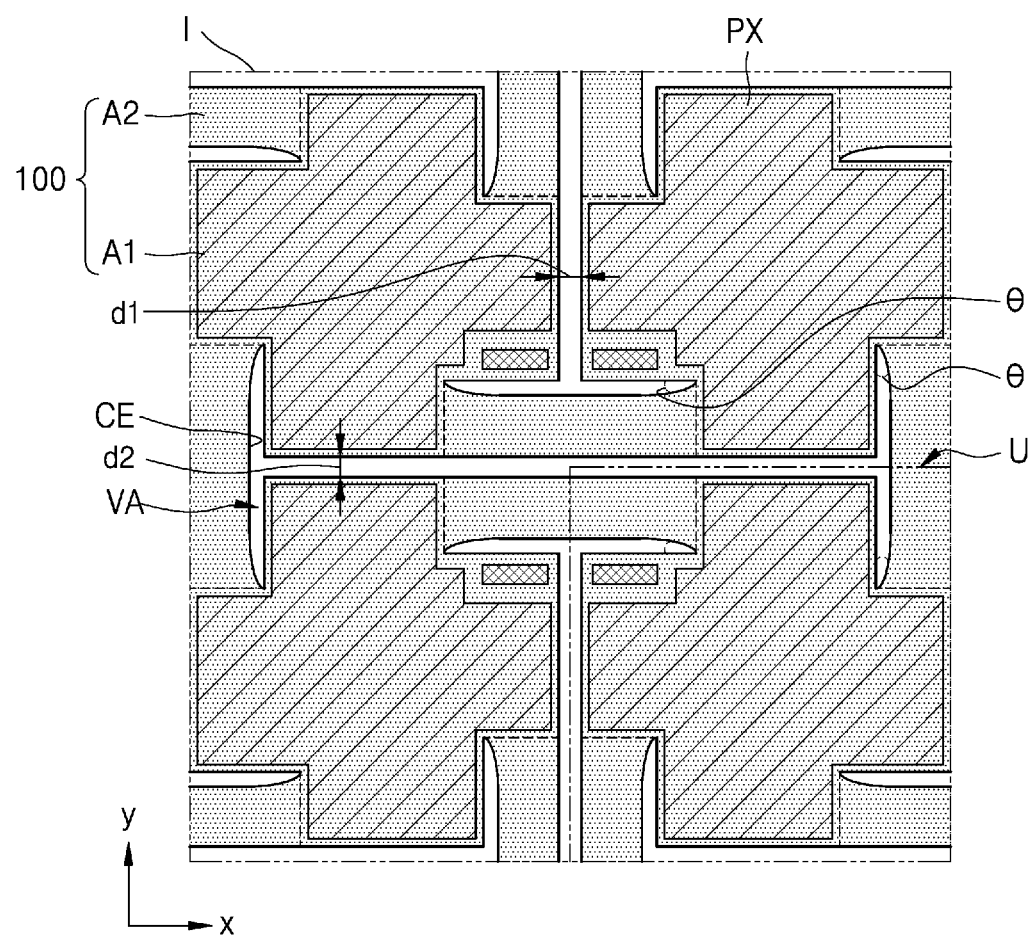
FIG. 10B is an enlarged plan view of a region of the display panel of FIG. 10A.
Figure 11:
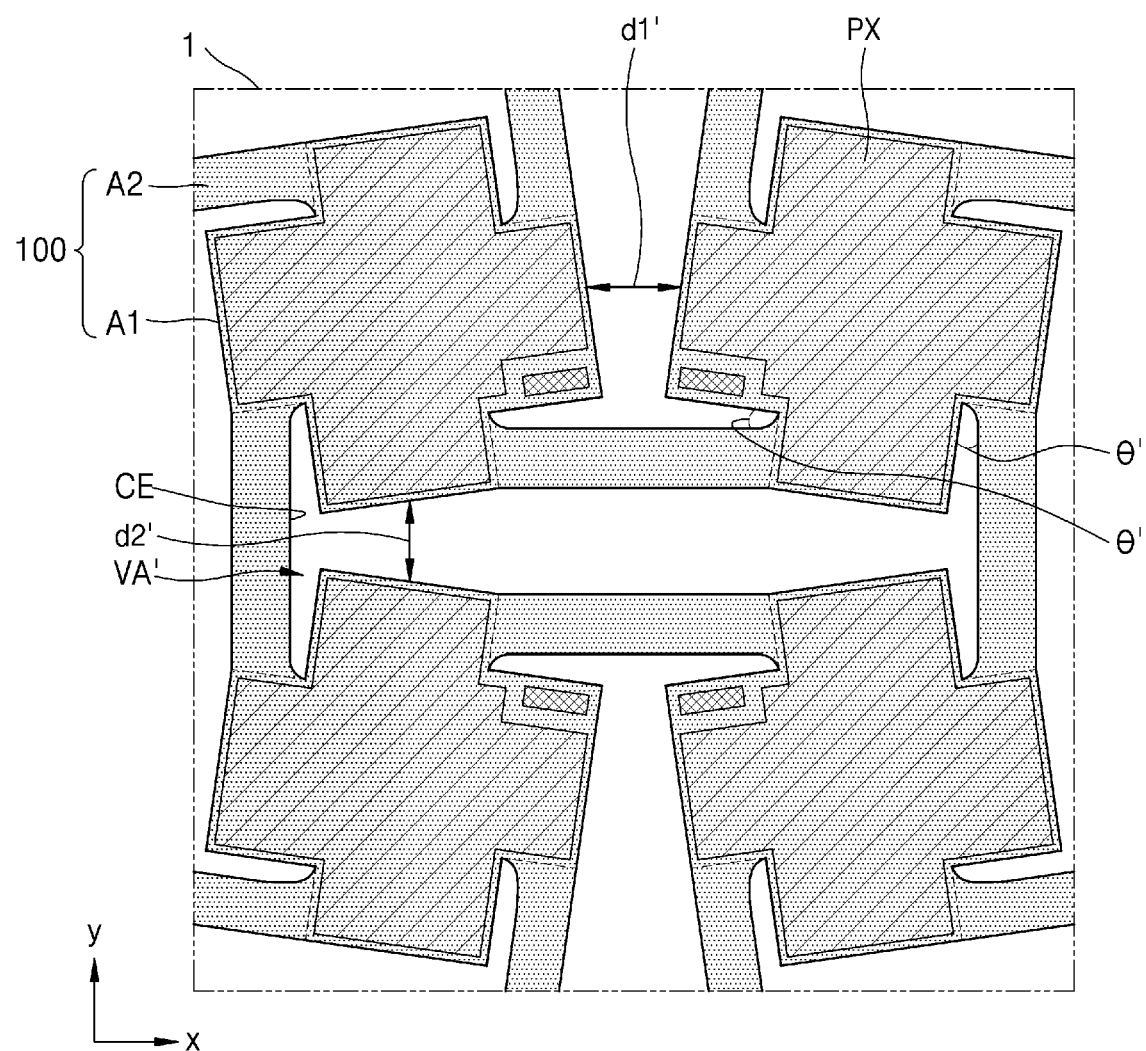
FIG. 11 is an enlarged view schematically illustrating a portion of the display panel of FIG. 10B.

FIGS. 10A and 10B are plan views schematically illustrating a display panel 10 according to an embodiment, and FIG. 11 is an enlarged plan view schematically illustrating the display panel 10 of FIGS. 10A and 10B to which a force is applied.

Referring to FIGS. 10A and 10B, and FIG. 11, the display panel 10 may include a substrate 100 and a pixel PX which is arranged on the substrate 100.

The substrate 100 may include various materials, such as a glass, a metal or an organic material. In an alternative embodiment, the substrate 100 may include a flexible material. In an embodiment, for example, the substrate 100 may include an ultra-thin flexible glass (e.g., a thickness of several tens to several hundreds of µm) or a polymer resin. When the substrate 100 includes a polymer resin, the substrate 100 may include polyimide. Alternatively, the substrate 100 may include polyethersulfone, polyarylate, polyetherimide, polyethyelenene napthalate, polyethyleneterephthalate, polyphenylene sulfide, polycarbonate, cellulose tri-acetate (TAC), or/and cellulose acetate propionate.

The substrate 100 may include a plurality of first areas A1 spaced apart from each other, a plurality of second areas A2 that surround at least a portion of the plurality of first areas A1 and connect the adjacent first areas A1 to each other, and a plurality of separation areas VA that are located between the plurality of second areas A2 and penetrate into the substrate 100.

The plurality of first areas A1 may be spaced apart from each other. In an embodiment, for example, the plurality of first areas A1 may form a lattice pattern that are repeatedly arranged in a first direction (e.g., an x-direction) and a second direction (e.g., a y-direction) different from the first direction (e.g., an x-direction). In an embodiment, the first direction (e.g., an x-direction) and the second direction (e.g., a y-direction) may be perpendicular to each other. In an embodiment, the first direction (e.g., an x-direction) and the second direction (e.g., a y-direction) may form an obtuse angle or an acute angle.

The pixel PX may be arranged in a plurality of first areas A1 In an embodiment, a plurality of pixels PX may be provided, and the plurality of pixels PX may display an image by emitting light. In an embodiment, each of the plurality of pixels PX may include a red sub-pixel Pr, a green sub-pixel Pg, and a blue sub-pixel Pb. Alternatively, each of the plurality of pixels PX may include a red sub-pixel Pr, a green sub-pixel Pg, a blue sub-pixel Pb and a white sub-pixel.

The plurality of second areas A2 may connect the adjacent first areas A1 to each other. Referring to FIG. 10B, for example, four second areas A2 may be connected to each first area A1 Four second areas A2 connected to one first area A1 may extend in different directions from a connection location with the one first area A1 and each of the second areas A2 may be connected to another first area A1 adjacent to one first area A1 described above. For example, one first area A1 may be connected to four first areas A1 arranged to surround the one first area A1 via four second areas A2.

The plurality of first areas A1 and the plurality of second areas A2 may be formed of the same material. That is, the plurality of first areas A1 and the plurality of second areas A2 may be integrally formed.

Hereinafter, for convenience of explanation, one first area A1 and a plurality of second areas A2 which are connected to the first area A1 will be referred to as one basic unit U, and the structure of the substrate 100 and the structure of a display device 1 will be described in more detail using the basic unit U. The basic unit U may be repeatedly arranged in the first direction and the second direction. It may be understood that the substrate 100 is formed by connecting basic units U repeatedly arranged to each other. Two adjacent basic units U may be symmetrical to each other. In an embodiment, for example, in FIG. 10B, two basic units U adjacent in a left/right direction (e.g., along the x-direction) may be symmetrical in the left/right direction based on a symmetry axis that is located between the two basic units U and is parallel to the y-direction. Similarly, in FIG. 10B, two basic units U adjacent in an up/down direction (e.g., along the y-direction) may be symmetrical based on a symmetry axis that is located between the two basic units U and is parallel to the x-direction.

Adjacent basic units U among the plurality of basic units U, for example, four basic units U shown in FIG. 10B may form a closed curve CE therebetween, and the closed curve CE may define the separation area VA that is an empty space. In an embodiment, for example, the separation area VA may be defined as the closed curve CE defined by outer edges of a plurality of first areas A1 together with outer edges of a plurality of second areas A2.

Each separation area VA may penetrate into the top surface and the bottom surface of the substrate 100, respectively, That is, the separation area VA may be open in opposite directions along the z-direction, at the top surface and the bottom surface of the substrate 100. Each separation area VA may provide a disconnection of the substrate 100 between the plurality of first areas A1, may reduce the weight of the substrate 100 and may enhance the flexibility of the substrate 100. Furthermore, when an external force (a bending or pulling force) is applied to the substrate 100, the shape of the separation areas VA changes so that the generation of stress during deformation of the substrate 100 may be easily reduced, abnormal deformation of the substrate 100 may be prevented, and durability may be enhanced.

Referring to FIG. 10B, the angle θ between an edge of a first area A1 and an edge of a second area A2 provided in one basic unit U may be an acute angle. When an external force, for example, a force for pulling the substrate 100 is applied, as shown in FIG. 11, the angle θ may be increased to an angle θ' between the edge of the first area A1 and the edge of the second area A2, and the area or shape of the separation area VA may be changed to a shape of a separation area VA. Further, an orientation of the first area A1 may also be changed by rotation within a plane defined by the x-direction and the y-direction crossing each other.

FIG. 11 is an enlarged plan view showing that the substrate 100 is stretched in the first direction and the second direction, and when the forces described above act on the substrate 100, each first area A1 may be rotated at a rotation angle through a change of the above-described angle θ' and an area increase and/or shape deformation of the separation area VA. A distance between the first area A1, for example, a first distance d1' and a second distance d2' may vary by location by the rotation of each of the first areas A1 within the plane.

When a force for pulling the substrate 100 is acting, a stress may be concentrated on the second area A2 connected to the edge of the first area A1. Thus, the closed curve CE for defining the separation area VA may include a curve so as to prevent damage of the substrate 100.

Figure 12:
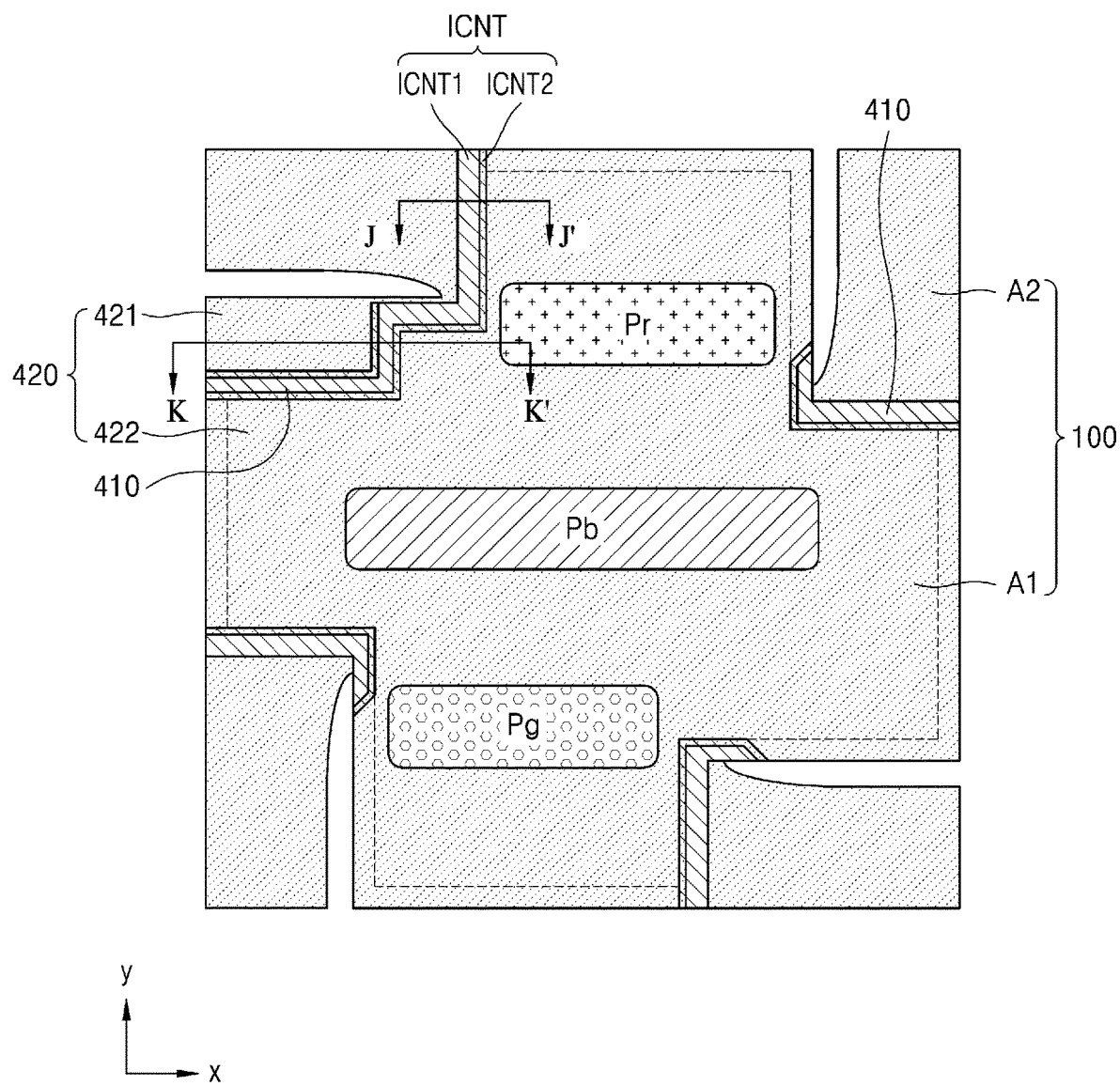
FIG. 12 is a plan view illustrating the structure of a basic unit that constitutes a display panel according to an embodiment.

FIG. 12 is a plan view illustrating the structure of a basic unit U that constitutes a display panel 10 according to an embodiment.

Referring to FIG. 12, a pixel PX may be arranged on the first area A1 of the substrate 100. In an embodiment, the pixel PX may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively.

In an embodiment, a red sub-pixel Pr, a blue sub-pixel Pb, and a green sub-pixel Pg may be spaced apart from each other in one direction. The red sub-pixel Pr, the blue sub-pixel Pb, and the green sub-pixel Pg may be spaced apart from each other in the second direction (e.g., a y-direction), and a distance (e.g., a shortest distance following the y-direction of FIG. 12) between adjacent sub-pixels may be substantially the same.

A lower pattern 410 may be arranged on the first area A1 along a boundary between the first area A1 and the second area A2. In an embodiment, for example, four lower patterns 410 may be arranged along a boundary between the first areas A1 and each of four second areas A2 that are connected to one first area A1 and extending in different directions from the one first area A1.

A spacer 230 may be located at one side of the first area A1 The lower pattern 410 may surround at least a portion of the spacer 230. The spacer 230 may prevent a structure and layers located under the spacer 230 from being damaged by a mask used during a process of providing a display panel 10.

An upper pattern 420 may be arranged on the first area A1. The upper pattern 420 may be arranged to overlap at least one side surface of the lower pattern 410 in a planar view. In an embodiment, for example, an end of the upper pattern 420 may be closer to the center of the lower pattern 410 than the side surface of the lower pattern 410. In an embodiment, the upper pattern 420 may include a first inorganic pattern 421 disposed on the spacer 230 in a portion of the first area A1, and a second inorganic pattern 422 disposed on the remaining portion of the first area A1. The first inorganic pattern 421 may be arranged to overlap one side surface (e.g., a first side surface) of the lower pattern 410 adjacent to the spacer 230 in a planar view. Similarly, the second inorganic pattern 422 may be arranged to overlap another side surface (e.g., a second side surface opposite to the first side surface) of the lower pattern 410 in a planar view.

Figure 13:
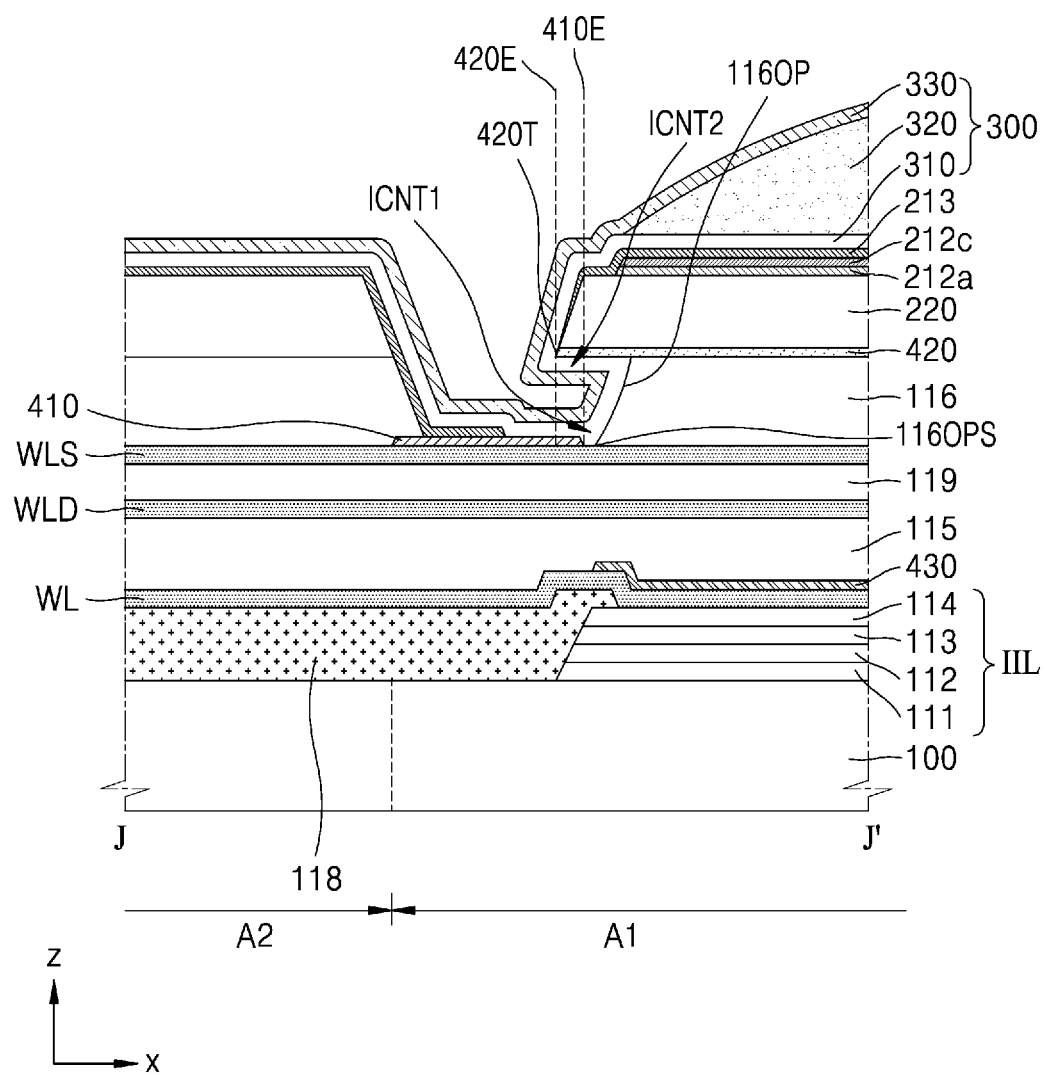
FIG. 13 is a plan view schematically illustrating a display panel according to an embodiment, taken along line H-H' of FIG. 12.
Figure 14:
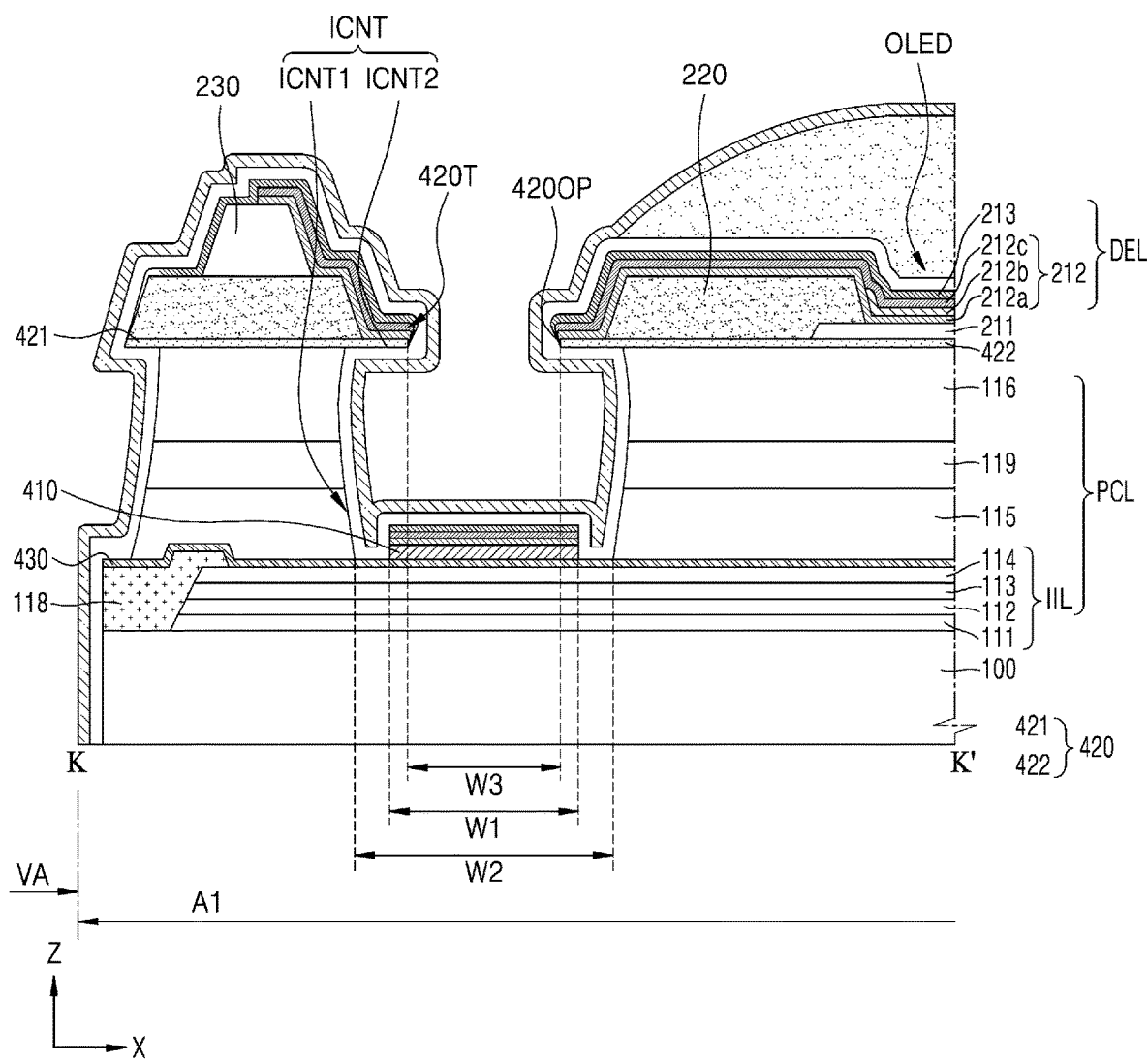
FIG. 14 is a cross-sectional view schematically illustrating a display panel according to an embodiment, taken along line I-I' of FIG. 12.

FIG. 13 is a cross-sectional view schematically illustrating a display panel 10 according to an embodiment taken along line H-H' of FIG. 12, and FIG. 14 is a cross-sectional view schematically illustrating a display panel 10 according to an embodiment taken along line I-I" of FIG. 12.

Referring to FIG. 13, a substrate 100 may include a first area A1 and a second area A2.

An inorganic insulating layer IIL may be arranged on the first area A1. The inorganic insulating layer IIL may include a buffer layer 111, a first gate insulating layer 112, a second gate insulating layer 113, and an interlayer insulating layer 114. The buffer layer 111 may be arranged on the substrate 100, The buffer layer 111 may include an inorganic insulating material such as silicon nitride ($SiN_x$), silicon oxynitride (SiON), and silicon oxide ($SiO_2$), and may have a single layer or multi-layered structure including the above-described inorganic insulating material.

The first gate insulating layer 112 and the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The interlayer insulating layer 114 may cover the upper electrode CE2. The interlayer insulating layer 114 may include silicon oxide ($SiO_2$), silicon nitride ($SiN_x$), silicon oxynitirde (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The interlayer insulating layer 114 may have a single layer or multi-layered structure including the above-described inorganic insulating materials.

The inorganic insulating layer IIL may not extend to the second area A2. In an embodiment, for example, the end of the inorganic insulating layer IIL may be located in the first area A1 and may be covered by a lower organic layer 118 extending to the second area A2. The lower organic layer 118 may include an organic insulating material such as PI.

A signal line WL that is connected to a pixel circuit PC arranged in the first area A1 and applies a signal may be arranged on the inorganic insulating layer IIL. In an embodiment, for example, the signal line WL may provide a data signal or/and a scan signal to a pixel circuit PC. The signal line WL may be a data line DL or/and a scan line SL. The signal line WL may extend from the second area A2 to the first area A1.

A lower inorganic layer 430 may be arranged to overlap the first area A1. The lower inorganic layer 430 may be arranged between the first insulating layer 115 and the pixel circuit PC. The lower inorganic layer 430 may include a single layer or multi-layered inorganic insulating layer including an inorganic material such as silicon nitride ($SiN_x$), silicon oxide ($SiO_2$) and/or silicon oxynitride (SiON).

A first insulating layer 115 may be arranged on the lower inorganic layer 430. The first insulating layer 115 may be arranged on at least one thin film transistor. The first insulating layer 115 may include an organic material. In an embodiment, for example, the first insulating layer 115 may include an organic insulating material such as a general-purpose polymer such as polymethylmethacrylate (PMMA) or polystyrene (PS), a polymer derivative having a phenol-based group, an acryl-based polymer, an imide polymer, an aryl ether-based polymer, an amide polymer, a fluorine-based polymer, a p-xylene-based polymer, a vinyl alcohol-based polymer, and a blend thereof.

A first power supply voltage supply line WLD and a second power supply voltage supply line WLS may be arranged on the first insulating layer 115. The first power supply voltage supply line WLD and the second power supply voltage supply line WLS may be located in different layers. In an embodiment, for example, a third insulating layer 119 for covering the first power supply voltage supply line WLD may be arranged between the first power supply voltage supply line WLD and the second power supply voltage supply line WLS. The first power supply voltage supply line WLD and the second power supply voltage supply line WLS may be arranged on different layers so that the space of the substrate 100 may be efficiently utilized.

The second insulating layer 116 may be arranged on the second power supply voltage supply line WLS. The second insulating layer 116 may have a first opening 116OP arranged along a boundary between the first area A1 and the second area A2. In an embodiment, for example, the first opening 116OP may have a depth penetrating the second insulating layer 116 so that the second insulating layers 116 disposed on the first area A1 and the second area A2 may be divided into two portions.

The lower pattern 410 may be arranged along the boundary between the first area A1 and the second area A2. At least one side surface of the lower pattern 410 may be separated from the sidewalls of the second insulating layer 116 which define the first opening 116OP. In an embodiment, for example, a first end 410E of the lower pattern 410 may be spaced apart from one sidewall 116OPS of the second insulating layer 116 which defines the first opening 116OP, by a distance. The lower pattern 410 may cover a portion of the second power supply voltage supply line WLS and may perform a function as an etch stopper or etch pattern for protecting layers under the lower pattern 410 when the first opening 116OP is formed.

The upper pattern 420 may be arranged on the second insulating layer 116 and may have a tip 420T that overlaps at least one side surface of the lower pattern 410 in a planar view. In an embodiment, the upper pattern 420 may be arranged on the first area A1 and may overlap the side surface of the adjacent lower pattern 410 in a planar view. In an embodiment, for example, a first end 420E of the upper pattern 420 may be closer to the center of the lower pattern 410 than the first end 410E of the lower pattern 410.

Although not shown, in an embodiment, the lower pattern 410 may include a plurality of sub-patterns 411. The plurality of sub-patterns 411 may be spaced apart from each other by a distance, and the tip 420T of the upper pattern 420 may overlap a side surface of at least one sub-pattern 411.

In an embodiment, an insulating pattern 115P may be arranged between the lower pattern 410 and the second power supply voltage supply line WLS. In this case, the width of the insulating pattern 115P may be less than the width of the lower pattern 410 and may have an overhang structure having a tip portion protruding from the side surface of the insulating pattern 115P.

In an embodiment, the lower pattern 410 may include a conductive material. In this case, the lower pattern 410 may be arranged on the same layer as the second power supply voltage supply line WLS or the first power supply voltage supply line WLD, or may be substituted with the second power supply voltage supply line WLS or the first power supply voltage supply line WLD.

A pixel-defining layer 220 may be arranged on the upper pattern 420. An opening 220OP of the pixel-defining layer 220 may define an emission area EMA of light emitted from the organic light emitting diode OLED. In an embodiment, for example, the width of the opening 220OP of the pixel-defining layer 220 may correspond to the width of a sub-pixel.

In an embodiment, the pixel-defining layer 220 may include an organic insulating material. In an embodiment, the pixel-defining layer 220 may include an inorganic insulating material such as silicon nitride ($SiN_x$), silicon oxynitride (SiON), or silicon oxide ($SiO_2$). In an embodiment, the pixel-defining layer 220 may include an organic insulating material and an inorganic insulating material. In embodiments, the pixel-defining layer 220 may include a light-blocking material and may be provided in black. The light-blocking material may include carbon black, carbon nanotubes, a resin or paste including a black dye, metal particles, such as nickel, aluminum, molybdenum, and an alloy thereof, metal oxide particles (e.g., chromium oxide), or metal nitride particles (e.g., chromium nitride). When the pixel-defining layer 220 includes a light-blocking material; reflection of external light due to metal structures arranged under the pixel-defining layer 220 may be reduced.

A first functional layer 212a and a second functional layer 212c may be arranged on the pixel-defining layer 220. The first functional layer 212a may include a hole transport layer (NTL), for example, or a hole transport layer and a hole injection layer (HIL). The second functional layer 212c may include an electron transport layer (ETL) and/or an electron injection layer (EIL).

The second electrode 213 may be disconnected or divided into two or more portions based on the side surface of the lower pattern 410 that overlaps the upper pattern 420 in a planar view. In an embodiment, for example, the most part of the second electrode 213 may be located on the upper pattern 420, and small portions thereof may remain on the top surface of the lower pattern 410 and along sidewalls of the first opening 116OP of the second insulating layer 116. Similarly, the second electrode 213 may not be deposited on the side surface of the lower pattern 410 that overlaps the upper pattern 420 in a planar view.

The second electrode 213 may be arranged on the first functional layer 212a and the second functional layer 212c. In an embodiment, the second electrode 213 may be an opposite electrode. The second electrode 213 may include a conductive material having a small work function. In an embodiment, for example, the second electrode 213 may include a (semi-)transparent layer including Ag, Mg, Al, Pt. Pd, Au, Ni, Nd, Ir, Cr, lithium (Li), calcium (Ca), or an alloy thereof. Alternatively, the second electrode 213 may further include a layer such as ITO, IZO, ZnO or $In_2O_3$ on the (semi-)transparent layer including the above-described materials.

In embodiments, a capping layer (not shown) may be further disposed on the second electrode 213. The capping layer may include LiF, an inorganic material, or/and an organic material.

The encapsulation layer 300 may be arranged on the second electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked on each other.

The first inorganic encapsulation layer 310 and the second inorganic encapsulation layer 330 may include one or more inorganic materials of aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SION), The organic encapsulation layer 320 may include a polymer-based material. The polymer-based material may include an acryl-based resin, an epoxy-based resin, PI, polyethylene, or the like. In an embodiment, the organic encapsulation layer 320 may include acrylate. In an embodiment, the organic encapsulation layer 320 may be arranged only in the first area A1 of the substrate 100.

As described above, the first functional layer 212a, the second functional layer 212c, and the second electrode 213 may not be formed on the side surface of the lower pattern 410 and along the bottom surface of the tip 420T of the upper pattern 420. In contrast, the first inorganic encapsulation layer 310 formed by chemical vapor deposition (CVD) has a relatively excellent step coverage and thus may also be formed on the side surface of the lower pattern 410 and along the bottom surface of the tip 420T of the upper pattern 420. In an embodiment, the first inorganic encapsulation layer 310 may be in direct contact with the side surface of the lower pattern 410 so that the first inorganic contact area ICNT1 may be formed. In addition, the first inorganic encapsulation layer 310 may be in direct contact with the bottom surface of the tip 420T of the upper pattern 420 so that a second inorganic contact area ICNT2 may be formed.

Referring to FIG. 14, a spacer 230 may be located at a corner portion of the first area A1 of the substrate 100.

The spacer 230 may be arranged on the pixel-defining layer 220. The spacer 230 may be configured to prevent damage of the substrate 100 and/or a multi-layer on the substrate 100 in a method of manufacturing a display device 1. In the case of a method of manufacturing a display panel 10, a mask sheet may be used, where the mask sheet may enter into or sag into the opening 220OP of the pixel-defining layer 220 or may be in close contact with the pixel-defining layer 220. The spacer 230 may prevent or reduce defects in which a portion of the substrate 100 and the mufti-layer may be damage or broken by the mask sheet when a deposition material is deposited on the substrate 100.

The spacer 230 may include an organic material such as PI. Alternatively, the spacer 230 may include an inorganic insulating material such as silicon nitride ($SiN_x$) or silicon oxide ($SiO_2$), or both an organic insulating material and an inorganic insulating material. In an embodiment, the spacer 230 may include a different material from that of the pixel-defining layer 220. Alternatively, in an embodiment, the spacer 230 may include the same material as that of the pixel-defining layer 220. In this case, the pixel-defining layer 220 and the spacer 230 may be formed together in a mask process using a halftone mask or the like.

In an embodiment, the upper pattern 420 may include a first inorganic pattern 421 that overlaps the spacer 230 and one side surface of the lower pattern 410, and a second inorganic pattern 422 that is spaced apart from the first inorganic pattern 421 with the lower pattern 410 therebetween and overlaps another side surface of the lower pattern 410 which is opposite to the one side surface.

At least one side surface of the lower pattern 410 may be exposed to outside the first insulating layer 115, through the through portion 115OP of the first insulating layer 115. In an embodiment, the center of the lower pattern 410 and the center of the through portion 115OP may overlap or be aligned with each other, and the second width W2 of the through portion 115OP may be greater than the first width W1 of the lower pattern 410. Thus, both of opposing side surfaces of the lower pattern 410 may be exposed to outside the first insulating layer 115 through the through portion 115OP.

In an embodiment, the third width W3 of the second opening 420OP of the upper pattern 420 which is arranged between the first inorganic pattern 421 and the second inorganic pattern 422, may be less than each of the first width W1 of the lower pattern 410 and the second width W2 of the through portion 115OP. In an embodiment, for example, the bottom surface of the tip 420T of the first inorganic pattern 421 and the second inorganic pattern 422 may be exposed to outside the second insulating layer 116, through the first opening 116OP of the second insulating layer 116. In an embodiment, the first inorganic pattern 421 may protrude from a respective sidewall of the second insulating layer 116, in an outer direction (e.g., an −x-direction) based on the first area A1 and may further form an outer tip.

The first functional layer 212a and the second functional layer 212c may be disconnected or divided into two or more portions based on the side surface of the lower pattern 410 that overlaps the upper pattern 420 in a planar view. Similarly, the second electrode 213 may be disconnected or divided into two or more portions based on the side surface of the lower pattern 410 that overlaps the upper pattern 420 in a planar view.

An encapsulation layer 300 may be arranged on the second electrode 213. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked on each other.

As described above, in an embodiment, the first inorganic encapsulation layer 310 may be in direct contact with the side surface of the lower pattern 410 and may form a first inorganic contact area ICNT1. In addition, the first inorganic encapsulation layer 310 may be in direct contact with the bottom surface of the tip 420T of the upper pattern 420 so that a second inorganic contact area ICNT2 may be formed.

In an embodiment, similarly to the structure of the display panel 10 shown in FIG. 8B, the through portion 115OP and the first opening 116OP may not overlap each other. In an embodiment, for example, an inorganic layer may be further arranged between the first insulating layer 115 and the second insulating layer 116, and the inorganic layer may cover the side surface of the first insulating layer 115 at the through portion 115OP to separate the first insulating layer 115 and the second insulating layer 116 from each other. In this case, the lower pattern 410 may be arranged on the inorganic layer.

In an embodiment, similarly to the structure of the display panel 10 shown in FIG. 9C, the lower pattern 410 may include a plurality of sub-patterns 411. The plurality of sub-patterns 411 may be spaced apart from each other by a distance, and the tip 420T of the upper pattern 420 may overlap a side surface of at least one sub-pattern 411.

In an embodiment, similarly to the structure of the display panel 10 shown in FIG. 9D, an insulating pattern 115P may be arranged between the lower pattern 410 at a bottom of the through portion 115OP. In this case, the width of the insulating pattern 115P may be less than the width of the lower pattern 410 and may have an overhang structure having a tip portion protruding from the side surface of the insulating pattern 115P.

In an embodiment, the lower pattern 410 may include a conductive material. In this case, the lower pattern 410 may be arranged on the same layer as the second power supply voltage supply line WLS or the first power supply voltage supply line WLD or may be replaced with the second power supply voltage supply line WLS or the first power supply voltage supply line WLD.

As described above, according to one or more embodiment, a display panel 10 and a display device 1 including the same, in which penetration of oxygen or moisture from the outside is minimized and the reliability of the display panel 10 and the display device 1 is enhanced, may be implemented. Of course, the scope of the present disclosure is not limited by these effects.

In the present specification, a display device 1 that is a device for displaying a video or a still image may be used as a display screen for various products, such as portable electronic devices, for example, mobile phones, smartphones, tablet personal computers (PCs), mobile communication terminals, electronic notebooks, e-books, and Portable Multimedia Players (PMPs), navigation devices, Ultra Mobile PCs (UMPCs), televisions, laptop computers, monitors, billboards, and Internet of Things (IOT), and the like. Also, a display device 1 according to an embodiment may be used in a wearable device such as a smart watch, a watch phone, a glasses-type display, and a head mounted display (HMD). In addition, the display device 1 according to an embodiment may be used as a vehicle instrument panel, a center information display (CID) disposed on a center fascia or a dashboard of a vehicle, a room mirror display that replaces a side mirror of the vehicle, or a display that is disposed on a rear surface of a front seat as an entertainment for a back seat of the vehicle.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate comprising a first area including a display element layer, and a second area which is adjacent to the first area; and
   on the substrate:
      a lower pattern in the second area, the lower pattern comprising a center and a side surface which is spaced apart from the center;
      an insulating layer in the first area and the second area, the insulating layer including a sidewall which defines an opening in the second area which exposes the side surface of the lower pattern to outside the insulating layer;
      an upper pattern on the insulating layer and defining a tip protruding further than the sidewall of the insulating layer and toward the center of the lower pattern, the tip overlapping the side surface of the lower pattern;
      the display element layer on the insulating layer and comprising a first electrode, an emission layer and a second electrode in order from the upper pattern; and
      an inorganic encapsulation layer on the display element layer,
      wherein the inorganic encapsulation layer is in direct contact with the lower pattern.

2. The display panel of claim 1, wherein the inorganic encapsulation layer is in direct contact with the side surface of the lower pattern.

3. The display panel of claim 1, wherein the inorganic encapsulation layer is in direct contact with the tip of the upper pattern.

4. The display panel of claim 1, wherein
   the insulating layer is between the substrate and the upper pattern and comprises a first insulating layer, an inorganic layer and a second insulating layer in order from the substrate, and
   the first insulating layer includes a sidewall which defines a through portion in the second area and spaced apart from the opening of the insulating layer, the through portion exposing a surface of the substrate to outside the first insulating layer, and
   the inorganic layer of the insulating layer covers the sidewall of the first insulating layer and the surface of the substrate.

5. The display panel of claim 1, wherein
   the lower pattern comprises a plurality of sub-patterns spaced apart from each other and each including a side surface to define a plurality of side surfaces of the lower pattern, and
   a side surface among the plurality of side surfaces of the plurality of sub-patterns overlaps the tip of the upper pattern.

6. The display panel of claim 1, wherein the lower pattern comprises a conductive material.

7. The display panel of claim 1, further comprising:
   the opening in the second area exposing a surface of the substrate to outside the insulating layer, and
   an insulating pattern between the surface of the substrate which is exposed at the opening, and the lower pattern, wherein
   each of the lower pattern and the insulating pattern has a width along the substrate, and
   the width of the lower pattern is greater than the width of the insulating pattern.

8. The display panel of claim 7, wherein
   the width of the lower pattern being greater than the width of the insulating pattern defines a protruding portion of the lower pattern which has a protruding bottom surface exposed outside the insulating pattern, and
   the inorganic encapsulation layer is in direct contact with the protruding bottom surface of the lower pattern.

9. The display panel of claim 1, wherein
   the substrate further comprises:
      a central area,
      the first area provided in plural including a plurality of first areas which each extend in a direction away from the central area, and
      a pair of first areas among the plurality of first areas spaced apart from each other with portions of the second area therebetween, and
   the portions of the second area which are between the pair of first areas, are disconnected from each other to define a separation area which is between the portions of the second area and exposes side surfaces of the substrate, the insulating layer and the upper pattern to outside the display panel.

10. The display panel of claim 9, wherein
   the lower pattern is extended along the plurality of first areas,
   the side surface of the lower pattern is provided in plural including an outer side surface and an inner side surface on opposing sides of the center, and the upper pattern comprises:
    a first inorganic pattern in the second area and overlapping the outer side surface of the lower pattern, and
    a second inorganic pattern in the first area and overlapping the inner side surface of the lower pattern.

11. The display panel of claim 9, further comprising a corner wiring in the second area, and extended along the plurality of first areas,
    wherein
    the opening further exposes the corner wiring to outside the insulating layer, and
    within the opening, the lower pattern is extended along the corner wiring.

12. A display device comprising:
    a display panel; and
    a cover window on the display panel,
    wherein
    the display panel comprises:
        a central area,
        a corner area bent from the central area, the corner area including a first area including a display element layer, and a second area which is adjacent to the first area;
        a lower pattern in the second area, the lower pattern comprising a center and a side surface which is spaced apart from the center;
        an insulating layer in the first area and the second area, the insulating layer comprising a sidewall which defines an opening in the second area which exposes the side surface of the lower pattern to outside the insulating layer;
        an upper pattern on the insulating layer and defining a tip protruding further than the sidewall of the insulating layer and toward the center of the lower pattern, the tip overlapping the side surface of the lower pattern;
        the display element layer on the insulating layer and comprising a first electrode, an emission layer and a second electrode in order from the upper pattern; and
        an inorganic encapsulation layer on the display element layer,
    wherein the inorganic encapsulation layer is in direct contact with the lower pattern.

13. The display device of claim 12, wherein
    the first area of the corner area is provided in plural including a plurality of first areas which each extend in a direction away from the central area,
    a pair of first areas among the plurality of first areas are spaced apart from each other with portions of the second area therebetween, and
    the portions of the second area which are between the pair of first areas are disconnected from each other to define a separation area which is between the portions of the second area and exposes side surfaces of the insulating layer and the upper pattern to outside the display panel.

14. A display panel comprising:
    a substrate comprising:
        a first area including a display element,
        a plurality of second areas which respectively extend away from the first area and in different directions, and
        a boundary respectively between the first area, and each of the plurality of second areas; and on the substrate:
    a lower pattern in the first area and extended along the boundary, the lower pattern comprising a center and a side surface which is spaced apart from the center;
    an insulating layer in the first area and the second area, the insulating layer including a sidewall which defines an opening which exposes the side surface of the lower pattern to outside the insulating layer;
    an upper pattern on the insulating layer and defining a tip protruding further than the sidewall of the insulating layer and toward the center of the lower pattern, the tip overlapping the side surface of the lower pattern;
    the display element on the insulating layer and comprising a first electrode, an emission layer and a second electrode in order from the upper pattern; and
    an inorganic encapsulation layer on the display element,
    wherein the inorganic encapsulation layer is in direct contact with the lower pattern.

15. The display panel of claim 14, wherein the inorganic encapsulation layer is in direct contact with the side surface of the lower pattern.

16. The display panel of claim 14, wherein
    the lower pattern comprises a plurality of sub-patterns spaced apart from each other and each including a side surface to define a plurality of side surfaces of the lower pattern, and
    a side surface among the plurality of side surfaces of the plurality of sub-patterns overlaps the tip of the upper pattern.

17. The display panel of claim 14, wherein
    the insulating layer is between the substrate and the upper pattern and comprises a first insulating layer, an inorganic layer and a second insulating layer in order from the substrate,
    the first insulating layer includes a sidewall which defines a through portion in the second area and spaced apart from the opening of the insulating layer, the through portion exposing a surface of the substrate to outside the first insulating layer, and
    the inorganic layer of the insulating layer covers the sidewall of the first insulating layer and the surface of the substrate.

18. The display panel of claim 14, further comprising:
    the opening exposing a surface of the substrate to outside the insulating layer, and
    an insulating pattern between the surface of the substrate which is exposed at the opening, and the lower pattern,
    wherein
    each of the lower pattern and the insulating pattern has a width along the substrate, and
    the width of the lower pattern is greater than the width of the insulating pattern.

19. The display panel of claim 14, further comprising a spacer in on the substrate, in the first area,
    wherein
    the lower pattern is extended along the spacer in the first area,
    the side surface of the lower pattern is provided in plural including a first side surface and a second side surface on opposing sides of the center, and
    the upper pattern comprises:
        a first inorganic pattern overlapping the spacer and the first side surface of the lower pattern, and
        a second inorganic pattern disconnected from the first inorganic pattern at the opening, with the lower pattern therebetween, and overlapping the second side surface of the lower pattern.

20. The display panel of claim 14, wherein the substrate further comprises a plurality of basic units each including the first area and the plurality of second areas, the plurality of basic units are disconnected from each other to define a separation area which is between basic units and exposes side surfaces of the substrate, the insulating layer and the upper pattern to outside the display panel, and the inorganic encapsulation layer further extends to the separation area and along the side surfaces of the insulating layer and the upper pattern which are exposed to outside the display panel.

* * * * *